(12) United States Patent
Lowes et al.

(10) Patent No.: US 10,622,522 B2
(45) Date of Patent: Apr. 14, 2020

(54) LED PACKAGES WITH CHIPS HAVING INSULATED SURFACES

(71) Applicant: CREE, INC., Durham, NC (US)

(72) Inventors: Theodore Lowes, Lompoc, CA (US);
Kurt W. Wilcox, Libertyville, IL (US);
Bernd Keller, Santa Barbara, CA (US);
Chandan Bhat, Goleta, CA (US)

(73) Assignee: Theodore Lowes, Durham, NC (US)

( * ) Notice: Subject to any disclaimer, the term of this patent is extended or adjusted under 35 U.S.C. 154(b) by 0 days.

(21) Appl. No.: 14/478,571

(22) Filed: Sep. 5, 2014

(65) Prior Publication Data
US 2016/0072022 A1  Mar. 10, 2016

(51) Int. Cl.
*H01L 33/48* (2010.01)
*H01L 33/44* (2010.01)
*H01L 33/50* (2010.01)

(52) U.S. Cl.
CPC ............ *H01L 33/486* (2013.01); *H01L 33/44* (2013.01); *H01L 33/505* (2013.01); *H01L 2224/32225* (2013.01); *H01L 2224/48227* (2013.01); *H01L 2224/49107* (2013.01); *H01L 2224/73265* (2013.01); *H01L 2924/181* (2013.01)

(58) Field of Classification Search
CPC ............ H01L 23/3192; H01L 23/3135; H01L 33/52–56
See application file for complete search history.

(56) References Cited

U.S. PATENT DOCUMENTS

| 3,760,237 A | 9/1973 | Jaffe ............................ 257/98 |
| 4,322,735 A | 3/1982 | Tetsuo et al. |
| 4,511,425 A | 4/1985 | Boyd ........................... 156/493 |

(Continued)

FOREIGN PATENT DOCUMENTS

| CH | 1977399 A | 6/2007 |
| CN | 1274906 A | 11/2000 |

(Continued)

OTHER PUBLICATIONS

Notice of Completion of Formalities for Patent Register from Chinese Patent Appl. No. 2011100391389, dated Mar. 9, 2015.

(Continued)

*Primary Examiner* — Joshua King
(74) *Attorney, Agent, or Firm* — Ferguson Case Orr Paterson LLP

(57) ABSTRACT

Emitter packages are disclosed that can include an insulating layer covering the emitter, such as between the emitter's primary emission surface and a lens or encapsulant. The packages can comprise a submount with an emitter flip-chip mounted such that the diode region is between the emitter's non-insulating and/or conductive substrate and the submount. The submount can then be covered with a thin insulating layer. The same or another insulating layer can cover other electrically active surfaces on the submount. By insulating the electrically active surfaces of the emitter and, in some embodiments, other electrically active surfaces, the package can meet UL8750 class 4 enclosure standards even if it does not meet the lens adhesion criteria. This can enable the use of cheaper and/or more optically efficient materials at the fixture level, since the package itself meets class 4 standards.

37 Claims, 24 Drawing Sheets

(56) References Cited

U.S. PATENT DOCUMENTS

| | | | | |
|---|---|---|---|---|
| 4,972,089 A * | 11/1990 | Stevenson | H01L 31/167 | |
| | | | 250/216 | |
| 5,042,048 A | 8/1991 | Meyer | 372/108 | |
| 5,122,943 A | 6/1992 | Pugh | 362/256 | |
| 5,130,761 A | 7/1992 | Toshiaki | 357/17 | |
| 5,381,599 A * | 1/1995 | Hall | H01L 21/563 | |
| | | | 174/521 | |
| 5,790,298 A | 8/1998 | Tonar | 359/267 | |
| 5,813,753 A | 9/1998 | Vriens et al. | 362/293 | |
| 5,942,770 A | 8/1999 | Ishinaga et al. | 257/89 | |
| 5,959,316 A | 9/1999 | Lowery | 257/98 | |
| 6,061,160 A | 5/2000 | Maruyama | 359/152 | |
| 6,183,100 B1 | 2/2001 | Suckow et al. | 362/135 | |
| 6,259,608 B1 | 7/2001 | Berardinelli et al. | 361/777 | |
| 6,296,367 B1 | 10/2001 | Parsons et al. | 362/183 | |
| 6,345,903 B1 | 2/2002 | Koike et al. | 257/E33.059 | |
| 6,359,236 B1 | 3/2002 | DiStefano et al. | 374/261 | |
| 6,376,902 B1 | 4/2002 | Arndt | 257/100 | |
| 6,392,294 B1 | 5/2002 | Yamaguchi | | |
| 6,447,124 B1 | 9/2002 | Fletcher et al. | 359/604 | |
| 6,454,437 B1 | 9/2002 | Kelly | 362/246 | |
| 6,536,913 B1 | 3/2003 | Yajima et al. | 362/231 | |
| 6,621,210 B2 | 9/2003 | Kato et al. | 313/496 | |
| 6,700,136 B2 | 3/2004 | Guida | 257/79 | |
| 6,707,069 B2 | 3/2004 | Song et al. | 257/79 | |
| 6,710,373 B2 | 3/2004 | Wang | 257/79 | |
| 6,717,353 B1 | 4/2004 | Mueller et al. | 313/501 | |
| 6,759,733 B2 | 7/2004 | Arndt | 257/672 | |
| 6,765,235 B2 | 7/2004 | Taninaka et al. | 257/88 | |
| 6,770,498 B2 | 8/2004 | Hsu | 438/26 | |
| 6,858,879 B2 | 2/2005 | Waitl et al. | 257/99 | |
| 6,964,877 B2 | 11/2005 | Chen et al. | 438/20 | |
| 6,995,510 B2 | 2/2006 | Murakami | | |
| D517,025 S | 3/2006 | Asakawa | D13/180 | |
| 7,009,285 B2 | 3/2006 | Su et al. | 257/680 | |
| 7,009,627 B2 | 3/2006 | Abe et al. | 345/690 | |
| 7,021,797 B2 | 4/2006 | Minano et al. | 362/355 | |
| 7,066,626 B2 | 6/2006 | Omata | 362/257 | |
| 7,119,422 B2 | 10/2006 | Chin | 257/666 | |
| 7,187,009 B2 | 3/2007 | Fukasawa et al. | 257/98 | |
| 7,224,000 B2 | 5/2007 | Aanegola et al. | 257/98 | |
| 7,244,965 B2 | 7/2007 | Andrews et al. | 257/98 | |
| 7,282,740 B2 | 10/2007 | Chikugawa et al. | 257/79 | |
| 7,282,785 B2 | 10/2007 | Yoshida | 257/666 | |
| 7,285,802 B2 | 10/2007 | Ouderkirk et al. | 257/98 | |
| 7,286,926 B2 | 10/2007 | Gotoh et al. | | |
| 7,303,315 B2 | 12/2007 | Ouderkirk et al. | 362/294 | |
| D572,210 S | 7/2008 | Lee | D13/180 | |
| D572,670 S | 7/2008 | Ono et al. | D13/180 | |
| D576,574 S | 9/2008 | Kobayakawa | D13/180 | |
| 7,429,757 B2 | 9/2008 | Oyama et al. | 257/675 | |
| 7,579,628 B2 | 8/2009 | Inoguchi | 257/81 | |
| 7,622,795 B2 | 11/2009 | Chiang | 257/675 | |
| 7,635,915 B2 | 12/2009 | Xie et al. | 257/692 | |
| 7,692,206 B2 | 4/2010 | Loh | 257/99 | |
| 7,777,412 B2 | 8/2010 | Pang | 313/506 | |
| 7,875,899 B2 | 1/2011 | Yasuda | 257/99 | |
| 7,923,831 B2 | 4/2011 | Ng | 257/692 | |
| 7,932,111 B2 | 4/2011 | Edmond | | |
| 7,939,848 B2 | 5/2011 | Kim | | |
| 8,217,414 B2 | 7/2012 | Hayashi | 257/99 | |
| 2002/0030194 A1 | 3/2002 | Camras et al. | | |
| 2002/0057057 A1 * | 5/2002 | Sorg | H01L 33/486 | |
| | | | 313/512 | |
| 2002/0061174 A1 | 5/2002 | Hurt et al. | | |
| 2002/0066905 A1 | 6/2002 | Wang | | |
| 2002/0123164 A1 * | 9/2002 | Slater, Jr. | H01L 33/20 | |
| | | | 438/39 | |
| 2002/0156187 A1 | 10/2002 | Greene | | |
| 2002/0171087 A1 | 11/2002 | Krames et al. | | |
| 2003/0116769 A1 | 6/2003 | Song et al. | | |
| 2003/0121511 A1 | 7/2003 | Hashimura et al. | | |
| 2003/0160256 A1 | 8/2003 | Durocher et al. | 257/88 | |
| 2003/0183852 A1 | 10/2003 | Takenaka | | |
| 2004/0016938 A1 | 1/2004 | Baretz et al. | 257/100 | |
| 2004/0037076 A1 | 2/2004 | Katoh et al. | 362/235 | |
| 2004/0041222 A1 | 3/2004 | Loh | | |
| 2004/0047151 A1 | 3/2004 | Bogner et al. | | |
| 2004/0079957 A1 | 4/2004 | Andrews et al. | | |
| 2004/0080939 A1 | 4/2004 | Braddell et al. | | |
| 2004/0090174 A1 | 5/2004 | Tasch et al. | | |
| 2004/0126913 A1 | 7/2004 | Loh | | |
| 2004/0201028 A1 | 10/2004 | Waitl | | |
| 2004/0207999 A1 | 10/2004 | Castillo et al. | 362/84 | |
| 2004/0227149 A1 | 11/2004 | Ibbetson | | |
| 2004/0238930 A1 | 12/2004 | Arndt | | |
| 2004/0256706 A1 | 12/2004 | Nakashima | | |
| 2005/0072981 A1 | 4/2005 | Suenaga | 257/88 | |
| 2005/0077535 A1 | 4/2005 | Li | | |
| 2005/0082574 A1 | 4/2005 | Tasch et al. | | |
| 2005/0110033 A1 | 5/2005 | Heremans et al. | 257/98 | |
| 2005/0152127 A1 | 7/2005 | Kamiya et al. | | |
| 2005/0156187 A1 | 7/2005 | Isokawa | | |
| 2005/0179041 A1 | 8/2005 | Harbers et al. | | |
| 2005/0179376 A1 | 8/2005 | Fung et al. | | |
| 2005/0199899 A1 | 9/2005 | Lin et al. | 257/99 | |
| 2005/0231983 A1 | 10/2005 | Dahm | 362/800 | |
| 2005/0253130 A1 | 11/2005 | Tsutsumi et al. | 257/13 | |
| 2006/0049477 A1 | 3/2006 | Arndt | | |
| 2006/0054912 A1 | 3/2006 | Murakami et al. | | |
| 2006/0060867 A1 | 3/2006 | Suehirom | 257/81 | |
| 2006/0091406 A1 | 5/2006 | Kaneko | 257/81 | |
| 2006/0102917 A1 | 5/2006 | Oyama | 257/99 | |
| 2006/0105478 A1 | 5/2006 | Camras et al. | | |
| 2006/0105485 A1 | 5/2006 | Basin | 438/27 | |
| 2006/0108594 A1 | 5/2006 | Iwasaki et al. | | |
| 2006/0131591 A1 | 6/2006 | Sumitani | | |
| 2006/0151809 A1 | 7/2006 | Isokawa | | |
| 2006/0180925 A1 | 8/2006 | Lee | 257/717 | |
| 2006/0186428 A1 * | 8/2006 | Tan | H01L 33/44 | |
| | | | 257/100 | |
| 2006/0220046 A1 | 10/2006 | Yu et al. | | |
| 2006/0267031 A1 | 11/2006 | Tasch et al. | | |
| 2006/0267042 A1 | 11/2006 | Izuno et al. | 257/100 | |
| 2006/0278882 A1 | 12/2006 | Leung et al. | 257/98 | |
| 2006/0284207 A1 | 12/2006 | Park | 257/99 | |
| 2006/0291185 A1 | 12/2006 | Atsushi | 362/29 | |
| 2007/0050530 A1 | 3/2007 | Seo | | |
| 2007/0096139 A1 | 5/2007 | Schultz | | |
| 2007/0145401 A1 | 6/2007 | Masahiro | | |
| 2007/0176193 A1 * | 8/2007 | Nagai | H01L 33/505 | |
| | | | 257/98 | |
| 2007/0215998 A1 * | 9/2007 | Hu | H01L 33/44 | |
| | | | 257/678 | |
| 2007/0221928 A1 | 9/2007 | Lee | 257/79 | |
| 2007/0241357 A1 | 10/2007 | Yan | 257/98 | |
| 2007/0262328 A1 | 11/2007 | Bando | | |
| 2007/0269586 A1 | 11/2007 | Leatherdale | | |
| 2007/0294975 A1 | 12/2007 | Nadar et al. | 52/483 | |
| 2007/0295975 A1 | 12/2007 | Omae | 257/89 | |
| 2008/0026498 A1 | 1/2008 | Tarsa et al. | 438/26 | |
| 2008/0032142 A1 * | 2/2008 | Tasumi | H01L 33/507 | |
| | | | 428/447 | |
| 2008/0041625 A1 | 2/2008 | Cheong | | |
| 2008/0074032 A1 | 3/2008 | Yano et al. | 313/503 | |
| 2008/0093606 A1 | 4/2008 | Yu-Tang et al. | | |
| 2008/0149960 A1 * | 6/2008 | Amo | H01L 33/486 | |
| | | | 257/98 | |
| 2008/0170391 A1 | 7/2008 | Norfidathul | | |
| 2008/0191610 A1 | 8/2008 | Oshio | | |
| 2008/0198594 A1 | 8/2008 | Lee | | |
| 2008/0230790 A1 | 9/2008 | Seko et al. | | |
| 2008/0258156 A1 | 10/2008 | Hata | 257/88 | |
| 2008/0258168 A1 | 10/2008 | Loh et al. | | |
| 2008/0296590 A1 | 12/2008 | Ng | 257/88 | |
| 2009/0050907 A1 | 2/2009 | Yuan et al. | | |
| 2009/0050924 A1 | 2/2009 | Edmond | | |
| 2009/0057708 A1 | 3/2009 | Abdul Karim et al. | 257/100 | |
| 2009/0072251 A1 | 3/2009 | Chan et al. | | |
| 2009/0091258 A1 * | 4/2009 | Heuser | H01L 33/50 | |
| | | | 313/512 | |
| 2009/0095966 A1 | 4/2009 | Keller et al. | 257/98 | |
| 2009/0108281 A1 * | 4/2009 | Keller | H01L 33/62 | |
| | | | 257/98 | |

(56) References Cited

U.S. PATENT DOCUMENTS

| | | | |
|---|---|---|---|
| 2009/0129085 A1 | 5/2009 | Aizar et al. | |
| 2009/0283781 A1 | 11/2009 | Chan et al. | |
| 2009/0283787 A1* | 11/2009 | Donofrio | H01L 33/405 257/98 |
| 2010/0044735 A1 | 2/2010 | Oyamada | 257/98 |
| 2010/0103660 A1 | 4/2010 | Van de Ven et al. | 362/231 |
| 2010/0155763 A1* | 6/2010 | Donofrio | H01L 33/50 257/98 |
| 2010/0155769 A1* | 6/2010 | Lin | H01L 21/486 257/99 |
| 2010/0181594 A1* | 7/2010 | Lin | H01L 21/486 257/99 |
| 2010/0193822 A1 | 8/2010 | Inobe et al. | 257/98 |
| 2010/0321920 A1* | 12/2010 | Wu | H01L 33/54 362/84 |
| 2011/0049545 A1 | 3/2011 | Basin et al. | 257/98 |
| 2011/0108874 A1 | 5/2011 | Chu | 257/98 |
| 2011/0121345 A1 | 5/2011 | Andrews et al. | |
| 2011/0147778 A1* | 6/2011 | Ichikawa | H01L 33/50 257/98 |
| 2011/0186880 A1 | 8/2011 | Kohler et al. | 257/91 |
| 2011/0193118 A1* | 8/2011 | Oshima | H01L 33/56 257/98 |
| 2011/0220920 A1* | 9/2011 | Collins | H01L 33/504 257/88 |
| 2011/0278617 A1 | 11/2011 | Lee | |
| 2012/0032355 A1* | 2/2012 | Wang | C08F 8/42 257/788 |
| 2012/0146066 A1* | 6/2012 | Tischler | H01L 27/156 257/89 |
| 2012/0193649 A1* | 8/2012 | Donofrio | H01L 25/0753 257/88 |
| 2012/0193660 A1* | 8/2012 | Donofrio | H01L 33/505 257/98 |
| 2012/0193661 A1* | 8/2012 | Emerson | H01L 33/20 257/98 |
| 2012/0235199 A1 | 9/2012 | Andrews et al. | |
| 2012/0257386 A1 | 10/2012 | Harbers et al. | 362/235 |
| 2012/0268957 A1 | 10/2012 | Premysler | 362/455 |
| 2012/0305949 A1* | 12/2012 | Donofrio | H01L 25/0753 257/88 |
| 2013/0056774 A1 | 3/2013 | Hong et al. | 257/98 |
| 2013/0063024 A1* | 3/2013 | Wada | H01L 33/56 313/512 |
| 2013/0328074 A1* | 12/2013 | Lowes | H01L 27/15 257/89 |
| 2013/0337591 A1 | 12/2013 | Chen | 438/27 |
| 2014/0027795 A1* | 1/2014 | Reiherzer | H01L 33/508 257/88 |
| 2014/0034986 A1* | 2/2014 | Bradley Jr. | H01L 33/60 257/98 |
| 2014/0175473 A1 | 6/2014 | Donofrio et al. | |
| 2015/0004726 A1* | 1/2015 | Konishi | H01L 33/501 438/27 |
| 2015/0137162 A1* | 5/2015 | Sabathil | H01L 33/52 257/98 |

FOREIGN PATENT DOCUMENTS

| | | | |
|---|---|---|---|
| CN | 1417868 A | 5/2003 | |
| CN | 2549313 | 5/2003 | |
| CN | 2617039 Y | 5/2004 | |
| CN | 1581527 A | 2/2005 | |
| CN | 1591924 A | 3/2005 | |
| CN | 1679168 A | 10/2005 | |
| CN | 1720608 A | 1/2006 | |
| CN | 1744335 A | 3/2006 | |
| CN | 1874011 A | 12/2006 | |
| CN | 1913135 A | 2/2007 | |
| CN | 101005109 A | 7/2007 | |
| CN | 101013689 | 8/2007 | |
| CN | 101360368 | 2/2009 | |
| DE | 202007012162 | 4/2008 | |
| DE | 102013215650 A1 * | 3/2015 | H01L 23/3135 |
| EP | 0684648 | 11/1995 | |
| EP | 1005085 A2 | 5/2000 | |
| EP | 1005085 A3 | 12/2000 | |
| EP | 1187226 | 3/2002 | |
| EP | 1187227 | 3/2002 | |
| EP | 1187228 | 3/2002 | |
| EP | 1418630 A1 | 5/2004 | |
| EP | 1521313 | 4/2005 | |
| EP | 1538680 A2 | 6/2005 | |
| EP | 1653254 A2 | 5/2006 | |
| EP | 1693904 | 8/2006 | |
| EP | 1850399 A1 * | 10/2007 | H01L 33/486 |
| EP | 1864780 | 12/2007 | |
| EP | 1953834 A1 | 8/2008 | |
| GB | 2420221 A | 12/2004 | |
| GB | 2458972 A | 10/2009 | |
| GB | 2466633 A | 7/2010 | |
| JP | 53118019 | 10/1978 | |
| JP | S53118019 | 10/1978 | |
| JP | S53126570 | 10/1978 | |
| JP | 5927559 A | 2/1984 | |
| JP | 59027559 | 2/1984 | |
| JP | 6148951 | 3/1986 | |
| JP | 6148951 A | 3/1986 | |
| JP | 61048951 | 3/1986 | |
| JP | S62160564 | 3/1986 | |
| JP | 62047156 | 2/1987 | |
| JP | 62140758 | 9/1987 | |
| JP | 038459 | 1/1991 | |
| JP | 07202271 | 8/1995 | |
| JP | 7202271 A | 8/1995 | |
| JP | 07231120 | 8/1995 | |
| JP | 08032120 | 2/1996 | |
| JP | 8139257 | 5/1996 | |
| JP | 10135492 | 5/1998 | |
| JP | 10321909 | 12/1998 | |
| JP | 11008405 | 1/1999 | |
| JP | 11054802 | 2/1999 | |
| JP | 11150306 | 6/1999 | |
| JP | 11261113 | 9/1999 | |
| JP | 2000188358 | 7/2000 | |
| JP | 2000223751 | 8/2000 | |
| JP | 2000261041 | 9/2000 | |
| JP | 2001168400 | 6/2001 | |
| JP | 2001237463 | 8/2001 | |
| JP | 2001518692 | 10/2001 | |
| JP | 2002009217 | 1/2002 | |
| JP | 2002223005 | 8/2002 | |
| JP | 2002280479 A | 9/2002 | |
| JP | 2002374005 | 12/2002 | |
| JP | 2003007946 A | 1/2003 | |
| JP | 2003197974 | 7/2003 | |
| JP | 2003218405 | 7/2003 | |
| JP | 2003264267 | 9/2003 | |
| JP | 2003318449 | 11/2003 | |
| JP | 2003324214 | 11/2003 | |
| JP | 2004022862 | 1/2004 | |
| JP | 2004056075 | 2/2004 | |
| JP | 2004103775 | 2/2004 | |
| JP | 2004507114 | 3/2004 | |
| JP | 2004111937 A | 4/2004 | |
| JP | 2004146815 | 5/2004 | |
| JP | 2004200236 | 7/2004 | |
| JP | 2004228387 | 8/2004 | |
| JP | 2004327955 | 11/2004 | |
| JP | 2004335740 | 11/2004 | |
| JP | 2004335880 | 11/2004 | |
| JP | 2004342870 | 12/2004 | |
| JP | 200519838 A | 1/2005 | |
| JP | 2005019838 | 1/2005 | |
| JP | 2005045199 | 2/2005 | |
| JP | 2005079167 | 3/2005 | |
| JP | 2005150624 | 6/2005 | |
| JP | 2005223222 | 8/2005 | |
| JP | 2005259754 | 9/2005 | |
| JP | 2005259972 | 9/2005 | |
| JP | 2005310935 | 11/2005 | |
| JP | 2005539386 | 12/2005 | |

(56) References Cited

FOREIGN PATENT DOCUMENTS

| | | |
|---|---|---|
| JP | 2006508537 | 3/2006 |
| JP | 2006509372 A | 3/2006 |
| JP | 2006108517 | 4/2006 |
| JP | 2006119357 | 5/2006 |
| JP | 2006179520 | 7/2006 |
| JP | 2006253689 | 9/2006 |
| JP | 2006324589 | 11/2006 |
| JP | 2006525679 | 11/2006 |
| JP | 2006332234 | 12/2006 |
| JP | 2006344692 | 12/2006 |
| JP | 200795797 A | 4/2007 |
| JP | 2007094088 | 4/2007 |
| JP | 2007109836 | 4/2007 |
| JP | 2007509505 | 4/2007 |
| JP | 2007142281 A * | 6/2007 ............ H01L 33/52 |
| JP | 2007165029 | 6/2007 |
| JP | 2007165840 | 6/2007 |
| JP | 2007184542 | 7/2007 |
| JP | 2007243226 | 9/2007 |
| JP | 2007273763 | 10/2007 |
| JP | 2007281323 | 10/2007 |
| JP | 2007317896 | 12/2007 |
| JP | 2007329516 | 12/2007 |
| JP | 2008518461 | 5/2008 |
| JP | 2008521236 | 6/2008 |
| JP | 2000223752 | 8/2008 |
| JP | H11054802 | 3/2011 |
| RU | 2251761 | 2/2005 |
| WO | WO 9931737 | 6/1999 |
| WO | WO 0217405 | 2/2002 |
| WO | WO 03049204 | 6/2003 |
| WO | WO 2004027882 | 1/2004 |
| WO | WO 200403660 | 4/2004 |
| WO | WO 2004036660 | 4/2004 |
| WO | WO 2004036660 A1 | 4/2004 |
| WO | WO 04044877 | 5/2004 |
| WO | WO 2004053933 A2 | 6/2004 |
| WO | WO 05043627 A1 | 5/2005 |
| WO | WO 05104247 | 11/2005 |
| WO | WO 2006016398 | 2/2006 |
| WO | WO 06054228 A2 | 5/2006 |
| WO | WO 06054228 A3 | 5/2006 |
| WO | WO 2006046981 | 5/2006 |
| WO | WO 2006054228 | 5/2006 |
| WO | WO 2006054228 | 6/2006 |
| WO | WO 2006135502 | 12/2006 |
| WO | WO 2007121486 A2 | 10/2007 |
| WO | WO 2007122516 | 11/2007 |
| WO | WO 2007127029 A2 | 11/2007 |
| WO | WO 2008081794 A1 | 7/2008 |
| WO | WO 2008082098 | 7/2008 |
| WO | WO 2010005294 | 1/2010 |
| WO | WO 2012099145 A1 | 7/2012 |

OTHER PUBLICATIONS

Office Action from European Patent Appl. No. 07840092.6-1551, dated May 4, 2015.
Notice of Allowance from Chinese Appl. No. 200880009255.7, dated Apr. 2, 2015.
Notice of Completion of Pretrial Reexamination from Japanese Appl. No. 2012-288000, dated May 22, 2015.
First Office Action from Chinese Appl. No. 2010106242824, dated Feb. 17, 2015.
Reasons for Rejection from Japanese Patent Appl. No. 2011-534993, dated Oct. 7, 2014.
Second Office Action from Chinese Patent Appl. No. 201080027586.0, dated Sep. 16, 2014.
Notification of Reexamination from Chinese Appl. No. 2010800016584, dated Sep. 11, 2014.
Decision to Grant from Russian Patent Appl. No. 2011146934/28, dated Aug. 14, 2014.
Extended European Search Report from European Patent Appl. No. 08253519.6, dated Aug. 13, 2014.
Office Action from U.S. Appl. No. 12/875,873, dated Jun. 25, 2014.
Response to OA from U.S. Appl. No. 12/875,873, filed Aug. 12, 2014.
Office Action from U.S. Appl. No. 12/069,827, dated Jul. 11, 2014.
Office Action from U.S. Appl. No. 12/695,978, dated Jul. 16, 2014.
Response to OA from U.S. Appl. No. 12/695,978, filed Aug. 11, 2014.
Decision on Appeal from Japanese Patent Appl. No. 2011-545616, dated Jun. 27, 2014.
Reason for Rejection from Japanese Patent Appl. No. 2009-507195, dated Jul. 15, 2014.
Notification of Allowance from Taiwan Appl. Patent No. 103202911, dated Jul. 16, 2014.
Office Action from Japanese Patent Appl. No. 2008-81533, dated Jul. 22, 2014.
Third Office Action and Search Report from Chinese Patent Appl. No. 2011100391389, dated Jun. 23, 2014.
Search Report from Chinese Patent Appl. No. 201210046248.2, dated Apr. 15, 2014.
International Preliminary Report on Patentability from PCT/US2012/065060, dated Jun. 12, 2014.
Notification of Reexamination from Chinese Patent Appl. No. 2008800092557, dated May 12, 2014.
Examination from European Patent Appl. No. 09 824 413.0-1551, dated May 16, 2014.
Decision on Rejection from Chinese Patent Appl. No. 2007101521097, dated Mar. 17, 2014.
Office Action from U.S. Appl. No. 11/982,275, dated Apr. 30, 2014.
Office Action from U.S. Appl. No. 12/002,410, dated May 20, 2014.
Office Action from U.S. Appl. No. 12/875,873, dated Feb. 25, 2014.
Office Action from U.S. Appl. No. 13/652,241, dated Mar. 12, 2014.
Office Action from U.S. Appl. No. 12/069,827, dated Apr. 1, 2014.
Decision of Rejection from Japanese Patent Appl. No. 2011-259253, dated Mar. 25, 2014.
Office Action from Russian Patent Appl. No. 2011146934/28, dated Feb. 28, 2014.
Second Office Action from Chinese Patent Appl. No. 201210046248.2, dated Apr. 15, 2014.
Partial European Search Report from European Patent Appl. No. 08253519.6-1564, dated Apr. 29, 2014.
Decision of Re-Examination from Chinese Patent Appl. No. 201110039138.9, dated Mar. 13, 2014.
First Office Action from Chinese Patent Appl. No. 201080027586.0, dated Feb. 8, 2014.
Office Action from U.S. Appl. No. 12/757,891, dated Jan. 14, 2014.
Office Action from U.S. Appl. No. 12/695,978, dated Jan. 31, 2014.
Office Action from U.S. Appl. No. 12/002,410, dated Feb. 4, 2014.
Fifth Office Action from Chinese Patent Appl. No. 2007/10152109.7, dated Jan. 6, 2014.
Supplemental European Search Report from European Patent Appl. No. 10731037.7, dated Jan. 9, 2014.
Search Report for European Patent Appl. No. 10731037.7, dated Dec. 11, 2013.
Notice of Reasons for Rejection from Japanese Patent Appl. No. 2011-534993, dated Nov. 12, 2013.
Notice of Reasons for Rejection from Japanese Patent Appl. No. 2007-211901, dated Oct. 8, 2013.
Notification of Loss of Rights from European Patent Appl. No. 09824413.0, dated Oct. 17, 2013.
Appeal board's Questioning from Japanese Patent Appl. No. 2011-545616, dated Nov. 12, 2013.
Office Action from U.S. Appl. No. 12/069,827, dated Oct. 25, 2013.
Office Action from U.S. Appl. No. 11/496,922, dated Oct. 9, 2013.
Office Action from U.S. Appl. No. 12/875,873, dated Oct. 18, 2013.
Office Action from U.S. Appl. No. 12/695,978, dated Sep. 17, 2013.
Office Action from U.S. Appl. No. 13/652,241, dated Sep. 11, 2013.
Office Action from U.S. Appl. No. 12/002,410, dated Sep. 10, 2013.
Office Action from Japanese Patent Appl. No. 2012-288000, dated Oct. 8, 2013.
Decision of Rejection from Chinese Patent Appl. No. 201110039138.9 dated Sep. 25, 2013.

(56) References Cited

OTHER PUBLICATIONS

Interrogation from Japanese Patent Appl. No. 2009-507195, dated Jan. 28, 2014.
Notification of Designation of the Appeal Examiner from Japanese Patent Appl. No. 2009-507195, dated Jan. 22, 2014.
Interrogation from Japanese Patent Appl. No. 2008-281533, dated Jan. 21, 2014.
International Search Report and Written Opinion from PCT/US2013/073921, dated Feb. 18, 2014.
Decision of Registration from Japanese Design Appl. No. 2012-030304, dated Jan. 21, 2014.
Appeal Decision from Japanese Patent Appl. No. 2008-515699, dated Sep. 20, 2013.
Decision of Rejection from Chinese Patent Appl. No. 201001067346.2, dated Aug. 30, 2013.
Fourth Office Action from Chinese Patent Appl. No. 200710152109.7, dated Jun. 28, 2013.
Office Action from U.S. Appl. No. 11/149,998, dated Jul. 26, 2013.
Office Action from U.S. Appl. No. 11/982,275, dated Aug. 8, 2013.
Office Action from U.S. Appl. No. 12/069,827, dated Jul. 3, 2013.
Office Action from U.S. Appl. No. 12/291,293, dated Aug. 20, 2013.
Notice of Reasons for Rejection from Japanese Patent Application No. 2007-211901, dated Apr. 9, 2013.
Decision of Rejection from Japanese Patent Application No. 2011-545616, dated Apr. 26, 2013.
Third Office Action from Chinese Patent Application No. 200710152109.7, dated Mar. 5, 2013.
Interrogation from Japanese Patent Application No. 2008-515699, dated Feb. 19, 2013.
Communication from European Patent Appl. No. 09824413.0-1551, dated Feb. 28, 2013.
European Search Report from European Patent Appl. No. 09824413.0-1551, dated Feb. 11, 2013.
Notice of Reasons for Rejection from Japanese Patent Appl. No. 2011-534993, dated Mar. 12, 2013.
Notification of the Second Office Action from Chinese Patent Application No. 201010167346.2, dated Feb. 17, 2013.
Extended Search Report for European Patent Application No. 09824413.0-1551, dated Feb. 11, 2013.
Second Office Action from Chinese Patent Appl. No. 201110039138.9, dated Jan. 31, 2013.
International Search Report and Written Opinion from PCT application No. PCT/US2012/065060, dated Feb. 20, 2013.
First Office Action from Chinese Patent Application No. 201080001658.4, dated Sep. 24, 2012.
Interrogation from Japanese Patent Application No. 2007-211901, dated Aug. 21, 2012.
Examination Report from European Patent Application No. 07789665.2, dated Aug. 20, 2012.
Decision of Rejection from Chinese Patent Application No. 200880009255.7, dated Sep. 5, 2012.
Notice of Reasons for Rejection from Japanese Patent Application No. 2009-507195, dated May 8, 2012.
First Office Action for Chinese Patent Application No. 200980153995.2, dated May 4, 2012.
First Office Action for Chinese Patent Application No, 200910145412.3, dated Apr. 28, 2012.
Office Action from U.S. Appl. No. 11/465,120, dated Jun. 19, 2012.
Office Action from U.S. Appl. No. 11/982,275, dated Jul. 9, 2012.
Office Action from U.S. Appl. No. 12/757,179, dated Jul. 16, 2012.
Notification of the First Office Action from Chinese Patent Application No. 201010167346.2, dated Feb. 29, 2012.
Decision of Rejection for Japanese Patent Application No. 2007-211901, dated Jan. 30, 2012.
First Office Action for Chinese Patent Application No. CN 200710152109.7 dated Jul. 29, 2011.
International Search Report and Written Opinion for PCT Appl. No. PCT/US2011/001457 dated Dec. 13, 2011.
Notice of Reasons for Rejection for Japanese Patent Appl. No. JP 2008-281533 dated Jun. 24, 2011.
Notice of Reasons for Rejection for Japanese Patent Appl. No. JP 2009-507195 dated Jun. 10, 2011.
Notice of Reasons for Rejection for Japanese Patent Appl. No. JP 2007-211901 dated Apr. 14, 2011.
Notice of Reasons for Rejection for Japanese Patent Appl. No. JP 2008-515699 dated May 19, 2011.
International Preliminary Report on Patentability for PCT/CN2010/070073 dated Apr. 28, 2011.
International Search Report and Written Opinion for counterpart PCT Application No. PCT/CN2010/001865 dated Jun. 9, 2011.
Office Action in related U.S. Appl. No. 12/002,410, dated Apr. 26, 2011.
Office Action in related U.S. Appl. No. 12/002,410, dated May 25, 2010.
Office Action in related U.S. Appl. No. 12/002,410, dated Dec. 13, 2010.
Office Action in related U.S. Appl. No. 11/149,998, dated May 11, 2011.
Office Action in related U.S. Appl. No. 11/149,998, dated Aug. 27, 2010.
Office Action in related U.S. Appl. No. 11/149,998, dated Jan. 24, 2011.
Office Action in related U.S. Appl. No. 11/149,998, dated Nov. 20, 2009.
Response to OA in related U.S. Appl. No. 11/149,998, dated Nov. 20, 2009, Response filed: Feb. 22, 2010.
Office Action in related U.S. Appl. No. 11/149,998, dated May 18, 2010.
Office Action in related U.S. Appl. No. 12/291,293, dated May 27, 2010.
Office Action in related U.S. Appl. No. 12/291,293, dated Sep. 3, 2010.
Office Action in related U.S. Appl. No. 12/291,293, dated Mar. 1, 2011.
Second Office Action for Chinese Patent Appl. No. CN 200880009255.7 dated Oct. 13, 2011.
Extended Supplementary European Search Report for EP Application No. EP07789665.2 dated Nov. 7, 2011.
Office Action from U.S. Appl. No. 12/291,293, dated Jul. 19, 2011.
Response to Office Action from U.S. Appl. No. 12/291,293, OA dated Jul. 19, 2011, Resp. dated Oct. 19, 2011.
Office Action from U.S. Appl. No. 11/465,120, dated Jun. 14, 2011.
Office Action from U.S. Appl. No. 12/069,827, dated Jun. 16, 2011.
Response to Office Action from U.S. Appl. No. 12/069,827, OA dated Jul. 16, 2011, Resp. dated Aug. 3, 2011.
Office Action from U.S. Appl. No. 12/321,059, dated Jun. 22, 2011.
Response to Office Action from U.S. Appl. No. 12/321,059, OA dated Jun. 22, 2011, Resp. dated Aug. 22, 2011.
Office Action from U.S. Appl. No. 12/321,059, dated Aug. 26, 2011.
Response to Office Action from U.S. Appl. No. 12/321,059, OA dated Jun. 22, 2011, Resp. dated Sep. 20, 2011.
Office Action from U.S. Appl. No. 11/496,922, dated Jul. 5, 2011.
Office Action from U.S. Appl. No. 12/695,978, dated Sep. 14, 2011.
Office Action from U.S. Appl. No. 11/149,998, dated Sep. 21, 2011.
Office Action from U.S. Appl. No. 12/321,059, dated Oct. 4, 2011.
Office Action from U.S. Appl. No. 12/069,827, dated Oct. 26, 2011.
U.S. Appl. No. 11/380,402, filed Apr. 26, 2006, Jian Hui Xie.
Nichia Corp. White LED Part No. NSPW300BS, Specification for Nichia White LED, Model NSPW300BS., Jan. 14, 2004.
Nicha Corp., White LED Part No. NSPW312BS, Specification for Nichia White LED, Model NSPW312BS. Jan. 14, 2004.
Kim J.K et al. "Strongly Enhanced Phosphor Efficiency in GaInN White Light-Emitting Diodes Using Remote Phosphor Configuration and Diffuse Reflector Cup" Japanese Journal of Applied Physics, Japan Society of Applied Physics, Tokyo, JP, vol. 44, No. 20-23, Jan. 1, 2005 XP-001236966, pp. 649-651.
Preliminary Notice of Reasons for Refusal re related Japanese Application No. 2009-009-002857, dated Jul. 24, 2009.
Related PCT International Search Report and Written Opinion, PCT/IB2007/002432, dated Jan. 11, 2008.
U.S. Appl. No. 14/053,404, filed Oct. 14, 2013, Heikman, et al.
International Search Report and Written Opinion for Appl. No. PCT/CN2010/070073 dated Apr. 15, 2010.

(56) References Cited

OTHER PUBLICATIONS

Office Action in related U.S. Appl. No. 11/496,922, dated Jun. 10, 2010.
Office Action in related U.S. Appl. No. 11/496,922, dated Dec. 15, 2010.
Office Action in related U.S. Appl. No. 12/152,766, dated Oct. 7, 2010.
Office Action in related U.S. Appl. No. 12/152,766, dated Apr. 1, 2011.
Office Action in related U.S. Appl. No. 12/152,766, dated Mar. 12, 2010.
Office Action in related U.S. Appl. No. 11/465,120, dated Sep. 8, 2010.
Office Action in related U.S. Appl. No. 11/465,120, dated Dec. 13, 2010.
Office Action in related U.S. Appl. No. 11/465,120, dated Mar. 9, 2010.
Office Action in related U.S. Appl. No. 12/635,818, dated Oct. 14, 2010.
Office Action in related U.S. Appl. No. 12/695,978, dated Dec. 20, 2010.
Office Action in related U.S. Appl. No. 12/695,978, dated May 10, 2011.
Office Action in related U.S. Appl. No. 12/069,827, dated Oct. 29, 2010.
Office Action in related U.S. Appl. No. 12/069,827, dated Apr. 20, 2010.
Office Action in related U.S. Appl. No. 12/069,827, dated Jan. 27, 2011.
Office Action in related U.S. Appl. No. 12/154,691, dated Dec. 17, 2009.
Response to OA in related U.S. Appl. No. 12/154,691, dated Dec. 17, 2009, Response filed: May 17, 2010.
Office Action in related U.S. Appl. No. 12/321,059, dated May 17, 2010.
CREE® XLAMP® MC-E LEDs Product Info Sheets, p. 1-3.
Nichia Corporation LEDs, Models NSSM016G, NSSM227, NESM026X, NSSM026BB, NESM005A, 9 Pages.
Office Action from U.S. Appl. No. 12/868,567, dated Jul. 5, 2013.
Office Action from U.S. Appl. No. 12/875,873, dated Jul. 3, 2013.
Office Action from U.S. Appl. No. 11/496,922, dated Jun. 26, 2013.
Office Action from U.S. Appl. No. 12/757,891, dated Jun. 18, 2013.
Office Action from U.S. Appl. No. 11/982,275, dated May 9, 2013.
Office Action from U.S. Appl. No. 12/069,827, dated Mar. 5, 2013.
Response to OA from U.S. Appl. No. 12/069,827, filed Jun. 5, 2013.
Office Action from U.S. Appl. No. 11/149,998, dated Apr. 3, 2013.
Response to OA from U.S. Appl. No. 11/149,998, filed Jun. 25, 2013.
Office Action from U.S. Appl. No. 12/868,567, dated Sep. 12, 2012.
Response to OA from U.S. Appl. No. 12/868,567, filed Jan. 14, 2013.
Office Action from U.S. Appl. No. 11/982,275, dated Sep. 18, 2012.
Response to OA from U.S. Appl. No. 11/982,275, filed Sep. 27, 2012.
Office Action from U.S. Appl. No. 12/002,410, dated Sep. 25, 2012.
Response to OA from U.S. Appl. No. 12/002,410, filed Dec. 18, 2012.
Office Action from U.S. Appl. No. 12/069,827, dated Aug. 9, 2012.
Response to OA from U.S. Appl. No. 12/069,827, filed Nov. 9, 2012.
Office Action from U.S. Appl. No. 11/465,120, dated Aug. 21, 2012.
Response to OA from U.S. Appl. No. 11/465,120, filed Aug. 24, 2012.
Office Action from U.S. Appl. No. 12/875,873, dated Aug. 22, 2012.
Response to OA from U.S. Appl. No. 12/875,873, filed Nov. 19, 2012.
Response to OA from U.S. Appl. No. 11/465,120, filed Aug. 15, 2012.
Response to OA from U.S. Appl. No. 11/982,275, filed Sep. 18, 2012.
Response to OA from U.S. Appl. No. 12/757,179, filed Sep. 25, 2012.
Office Action from U.S. Appl. No. 12/069,827, dated Dec. 6, 2012.
Response to OA from U.S. Appl. No. 12/069,827, filed Jan. 29, 2013.
Office Action from U.S. Appl. No. 11/982,275, dated Nov. 28, 2012.
Response to OA from U.S. Appl. No. 11/982,275, filed Mar. 21, 2013.
Office Action from U.S. Appl. No. 11/496,922, dated Nov. 23, 2012.
Response to OA from U.S. Appl. No. 11/496,922, filed Apr. 23, 2013.
Office Action from U.S. Appl. No. 12/757,891, dated Nov. 28, 2012.
Response to OA from Patent Appl. No. 12/757,891, filed Jan. 28, 2013.
Office Action from U.S. Appl. No. 13/306,589, dated Feb. 20, 2013.
Response to OA from U.S. Appl. No. 13/306,589, filed May 16, 2013.
Office Action from U.S. Appl. No. 12/002,410, dated Jan. 29, 2013.
Response to OA from U.S. Appl. No. 12/002,410, filed Apr. 18, 2013.
Office Action from U.S. Appl. No. 12/868,567, dated Feb. 22, 2013.
Response to OA from U.S. Appl. No. 12/868,567, filed May 21, 2013.
Office Action from U.S. Appl. No. 12/875,873, dated Feb. 21, 2013.
Response to OA from U.S. Appl. No. 12/875,873, filed Apr. 19, 2013.
Office Action from U.S. Appl. No. 12/291,293, dated Feb. 28, 2013.
Response to OA from U.S. Appl. No. 12/291,293, filed Jun. 5, 2013.
Office Action from U.S. Appl. No. 12/695,978, dated Apr. 18, 2013.
Response to OA from U.S. Appl. No. 12/695,978, filed Jul. 10, 2013.
Office Action from U.S. Appl. No. 11/465,120, dated Dec. 9, 2011.
Office Action from U.S. Appl. No. 12/002,410, dated Mar. 28, 2012.
Office Action from U.S. Appl. No. 12/002,410, dated Dec. 21, 2011.
Response to Office Action for U.S. Appl. No. 12/002,410, filed Mar. 8, 2012.
Office Action from U.S. Appl. No. 12/757,179, dated Jan. 19, 2012.
Office Action from U.S. Appl. No. 11/496,922, dated Feb. 9, 2012.
Response to Office Action for U.S. Appl. No. 11/496,922, filed Apr. 6, 2012.
Advisory Action for U.S. Appl. No. 11/496,922, dated Apr. 18, 2012.
Office Action from U.S. Appl. No. 12/321,059, dated Feb. 10, 2012.
Response to Office Action for U.S. Appl. No. 12/321,059, filed Apr. 9, 2012.
Advisory Action from U.S. Appl. No. 12/321,059, dated Apr. 20, 2012.
Office Action from U.S. Appl. No. 12/695,978, dated Mar. 14, 2012.
Office Action from U.S. Appl. No. 11/982,275, dated Mar. 23, 2012.
Office Action from U.S. Appl. No. 12/614,989, dated Mar. 12, 2012.
Office Action from U.S. Appl. No. 12/069,827, dated Apr. 3, 2012.
Japanese Patent Application 2001-60072, dated: Mar. 6, 2001.
Related Office Action from U.S. Appl. No. 11/277,717, dated Jan. 6, 2009.
Related Office Action from related U.S. Appl. No. 11/277,717, dated Jul. 27, 2009.
U.S. Appl. No. 11/656,759, filed Jan. 22, 2007, Chitnis, et al.
U.S. Appl. No. 11/899,790, filed Sep. 7, 2007, Chitnis, et al.
U.S. Appl. No. 11/473,089, filed Jun. 21, 2006, Tarsa, et al.
U.S. Appl. No. 13/770,389, filed Feb. 19, 2013, Lowes, et al.
U.S. Appl. No. 13/759,229, filed Feb. 5, 2013, Hussell, et al.
U.S. Appl. No. 13/369,996, filed Feb. 9, 2012, Donofrio.
U.S. Appl. No. 12/008,477, filed Jan. 11, 2008, Chitnis, et al.
U.S. Appl. No. 13/034,501, filed Feb. 24, 2011, Le, et al.
U.S. Appl. No. 13/028,946, filed Feb. 16, 2011, Le, et al.
U.S. Appl. No. 13/368,217, filed Feb. 17, 2012, Pickard, et al.
U.S. Appl. No. 12/837,303, filed Jul. 15, 2010, Edmond, et al.
White Optics, LLC New Castle, DE "White 96 Advanced Coating", available on http://whiteoptics.com/whiteoptics-advanced-coatings/.
Cree® XLamp® XQ-B LED Product Family Data Sheet from www.cree.com/xlamp.

(56) References Cited

OTHER PUBLICATIONS

Cree® XLamp® XQ-D LED Product Family Data Sheet from www.cree.com/xlamp.
Direct Attach DA1000 LEDs Data, Sheet CPR3ES Rev A from Cree, www.cree.com.
Direct Attach DA700 LEDs Data Sheet CPR3EU Rev from Cree, www.cree.com.
Direct Attach DA2432 LEDs Data Sheet CPR3FM Rev A from Cree, www.cree.com.
Direct Attach DA3547 LEDs Data Sheet CPR3EL Rev D from Cree, www.cree.com.
Notification of Reexamination from Chinese Appl. No. 2010101673462, dated Jan. 12, 2015.
Third Office Action from Chinese Appl. No. 2008800092557, dated Dec. 29, 2014.
Third Office Action from Chinese Patent Appl. No. 2012100462482, dated Oct. 10, 2014.
Decision of Re-Examination from Chinese Appl. No. 200880009255.7, dated Oct. 22, 2014.
Pretrial Report from Japanese Appl. No. 2011-259253, dated Sep. 30, 2014.
Decision of Rejection from Japanese Appl. No. 2012-288000, dated Oct. 28, 2014.
Fourth Office Action from Chinese Appl. No. 2011100391389, dated Nov. 24, 2014.
Decision of Patent Grant from Japanese Appl. No. 2011-534993, dated Dec. 24, 2014.
Office Action from U.S. Appl. No. 12/875,873, dated Oct. 3, 2014.
Office Action from U.S. Appl. No. 11/982,275, dated Oct. 15, 2014.
Office Action from U.S. Appl. No. 12/069,827, dated Oct. 28, 2014.
Office Action from U.S. Appl. No. 12/002,410, dated Nov. 4, 2014.
Office Action from U.S. Appl. No. 13/652,241, dated Nov. 19, 2014.
Examination Report from EU Application No. 07 789 665.2, dated Jan. 21, 2015.
Third Office Action from Chinese Appl. No. 201080027586.0, dated Jan. 21, 2015.
Office Action from Taiwanese Appl. No. 099113616, dated Dec. 26, 2014.
Office Action from U.S. Appl. No. 12/069,827, dated Feb. 6, 2015.
Office Action from U.S. Appl. No. 12/002,410, dated Feb. 23, 2015.
Notice of Issuance from Chinese Appl. No. 201210046248.2, dated Jun. 11, 2015.
First Office Action from Chinese Patent Appl. No. 2011800511887, dated Apr. 30, 2015.
Examination Report from Taiwanese appl. No. 100130234, dated Jun. 24, 2015.
Examination Report from Taiwanese Patent Appl. No. 100131665, dated Jul. 8, 2015.
International Preliminary Report on Patentability from appl. No. PCT/US2013/073921, dated Jun. 25, 2015.
Notice of Re-examination from Chinese Patent Appl. No. 200710152109.7, dated Jun. 9, 2015.
Pretrial Report from Japanese Appl. No. 2012-288000, dated May 19, 2015.
Fourth Office Action from Chinese Patent Appl. No. 201080027586.0, dated Jul. 29, 2015.
Office Action from U.S. Appl. No. 12/002,410, dated Jun. 17, 2015.
Response to OA from U.S. Appl. No. 12/002,410, filed Aug. 14, 2015.
Office Action from U.S. Appl. No. 12/069,827, dated Jun. 19, 2015.
Response to OA from U.S. Appl. No. 12/069,827, filed Aug. 19, 2015.
Office Action from U.S. Appl. No. 12/875,873, dated Jun. 29, 2015.
Appeal Decision from Japanese Patent Appl. No. 2013-18375, dated Mar. 10, 2015.
Office Action from Japanese Patent Appl. No. 2013-18883, dated Feb. 24, 2015.
Noting of loss of rights from European Patent Appl. No. 08253519.6-1558/2056363, dated Apr. 16, 2015.
Notice of Reasons for Rejection from Japanese Patent Appl. No. 2011-259253, dated Feb. 3, 2015.
Office Action from U.S. Appl. No. 12/875,873, dated Mar. 2, 2015.
Response from U.S. Appl. No. 12/875,873, filed Apr. 22, 2015.
Office Action from U.S. Appl. No. 13/652,241, dated Mar. 17, 2015.
Office Action from U.S. Appl. No. 13/804,309, dated Mar. 10, 2015.
Reexamination Decision from Chinese Patent Appl. No. 200710152109.7, dated Nov. 26, 2015.
Second Office Action from Chinese Patent Appl. No. 2010106242824, dated Dec. 29, 2015.
Notice of Allowance from Taiwanese Patent Appl. No. 100131665, dated Dec. 15, 2015.
Office Action from U.S. Appl. No. 12/069,827, dated Nov. 12, 2015.
Office Action from U.S. Appl. No. 12/002,410, dated Nov. 30, 2015.
Patent Certificate from Chinese Patent Appl. No. ZL2008800092557, dated Jul. 15, 2015.
Notice of Allowance from Taiwanese Patent Appl. No. 099113616, dated Sep. 2, 2015.
Office Action from U.S. Appl. No. 13/652,241, dated Sep. 11, 2015.
Notice of Allowance from Chinese Patent Appl. No. 201180051188.7, dated Feb. 3, 2016.
Decision of Rejection from Taiwanese Patent Appl. No. 100130234, dated Feb. 22, 2016.
Office Action from U.S. Appl. No. 12/875,873; dated Jan. 29, 2016.
Office Action from U.S. Appl. No. 14/329,807; dated Feb. 17, 2016.
Office Action from U.S. Appl. No. 12/069,827; dated Mar. 1, 2016
Office Action from U.S. Appl. No. 13/652,241; dated Mar. 10, 2016.
Office Action for Chinese Application No. 2010106242824; dated Apr. 15, 2016.
Office Action for Chinese Application No. 2010101673462; dated Apr. 26, 2016.
Office Action for U.S. Appl. No. 12/002,410; dated Jun. 14, 2016.
Office Action for U.S. Appl. No. 14/705,228; dated Jun. 17, 2016.
Office Action for U.S. Appl. No. 13/652,241; dated Jul. 1, 2016.
Foreign Office Action for Chinese Application No. 2012800586074; dated Nov. 21, 2016.
Office Action for U.S. Appl. No. 14/705,228; dated Nov. 25, 2016.
Examination Report from European Application No. 7789665.2; dated Jul. 13, 2016.
Office Action for U.S. Appl. No. 12/069,827; dated Jul. 14, 2016.
Office Action for U.S. Appl. No. 12/875,873; dated Aug. 12, 2016.
Office Action for U.S. Appl. No. 14/329,807; dated Aug. 15, 2016.
Foreign Office Action for Chinese Application 2010106242824; dated Sep. 5, 2016.
Office Action for U.S. Appl. No. 13/652,241; dated Sep. 29, 2016.
Luxeon Rebel Power Light Source Technical Datasheet DS56; Dated Jul. 2007.
Luxeon Rebel Lumileds Reliability Datasheet RD07; Dated Mar. 2007.
Luxeon rebel Assembly and Handling Information Application Brief AB32; Mar. 2007.
Foreign Notice of Allowance for Taiwan Application No. 100130234; dated Feb. 9, 2017.
Office Action for U.S. Appl. No. 12/875,873; dated Feb. 9, 2017.
Foreign Office Action for European Application No. 7789665.2; dated Mar. 17, 2017.
Office Action for U.S. Appl. No. 12/002,410; dated Nov. 3, 2017.
European Office Action for Application No. 08713756.8; dated Oct. 18, 2017.
European Documents for Grant for Application No. 08713756.8; WO 2008/089165; PCT/US2008/051039.
Indian Examination Report for Application No. 8640/DELNP/2011; dated Jun. 15, 2018.
Office Action for U.S. Appl. No. 12/875,873; dated May 29, 2018.
Office Action for U.S. Appl. No. 12/875,873; dated Aug. 28, 2018.
Office Action for U.S. Appl. No. 12/875,873; dated Jan. 12, 2018.
Office Action for U.S. Appl. No. 14/705,228; dated Mar. 22, 2018.
Office Action for U.S. Appl. No. 12/002,410; dated Mar. 29, 2018.

* cited by examiner

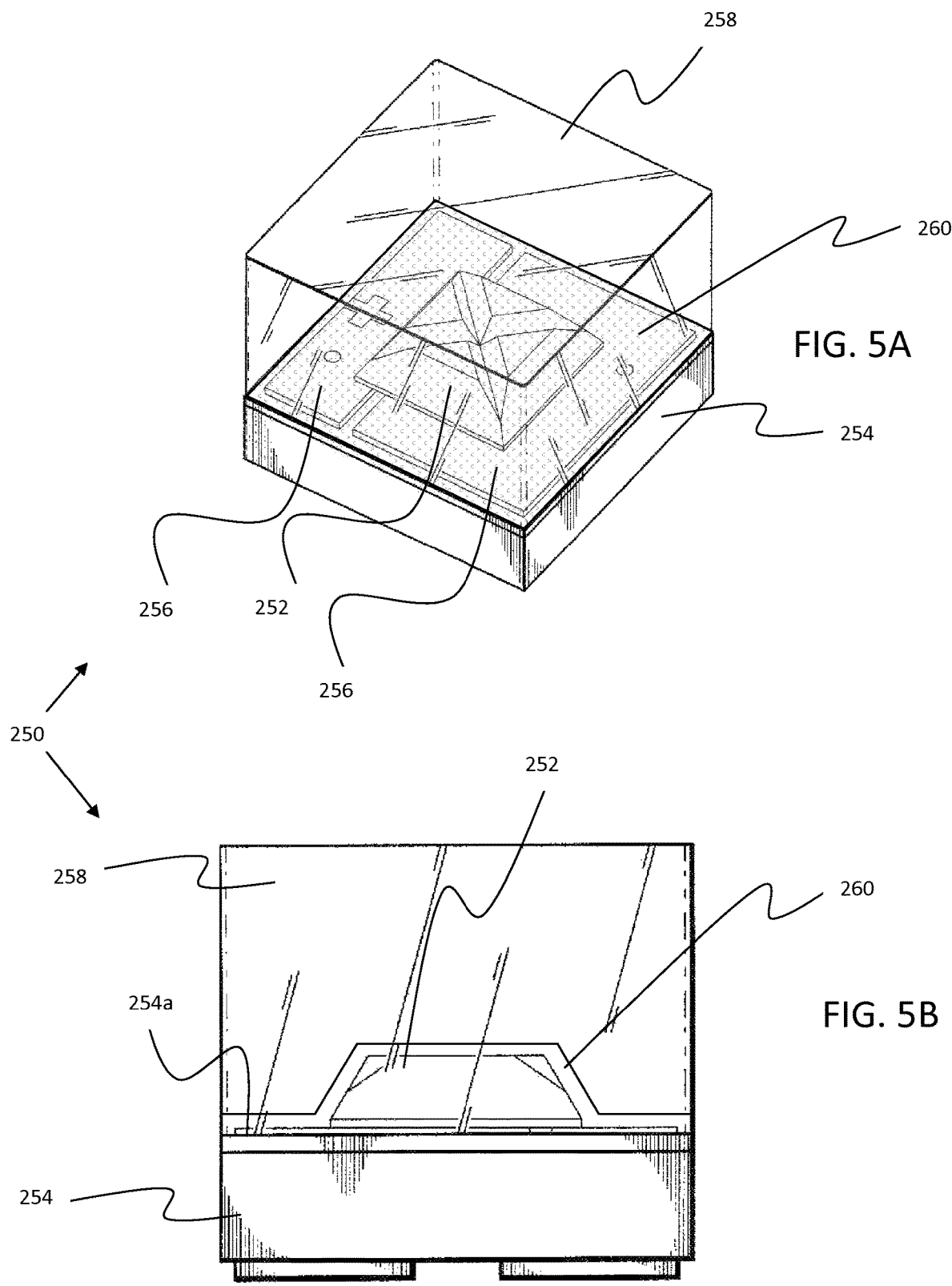

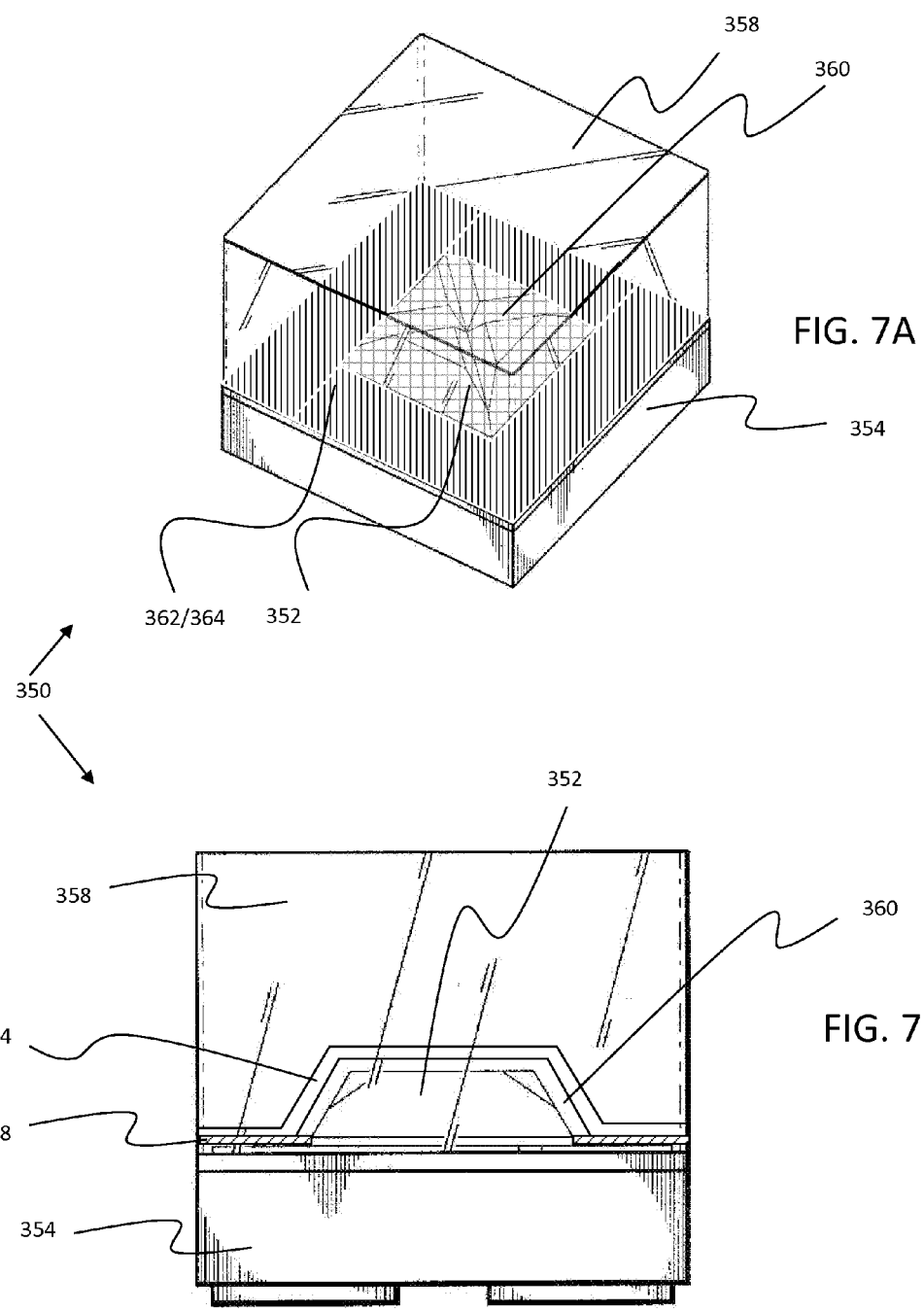

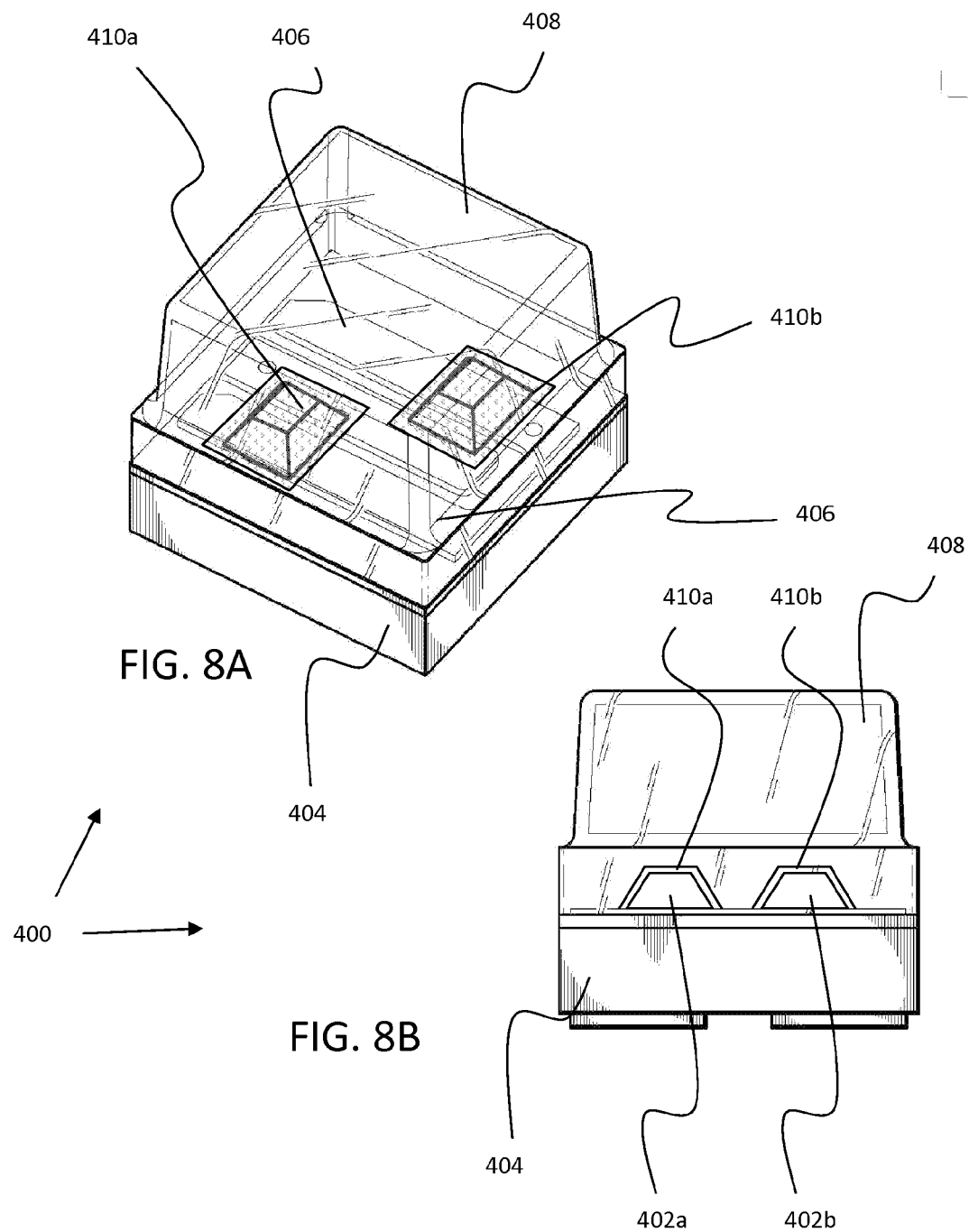

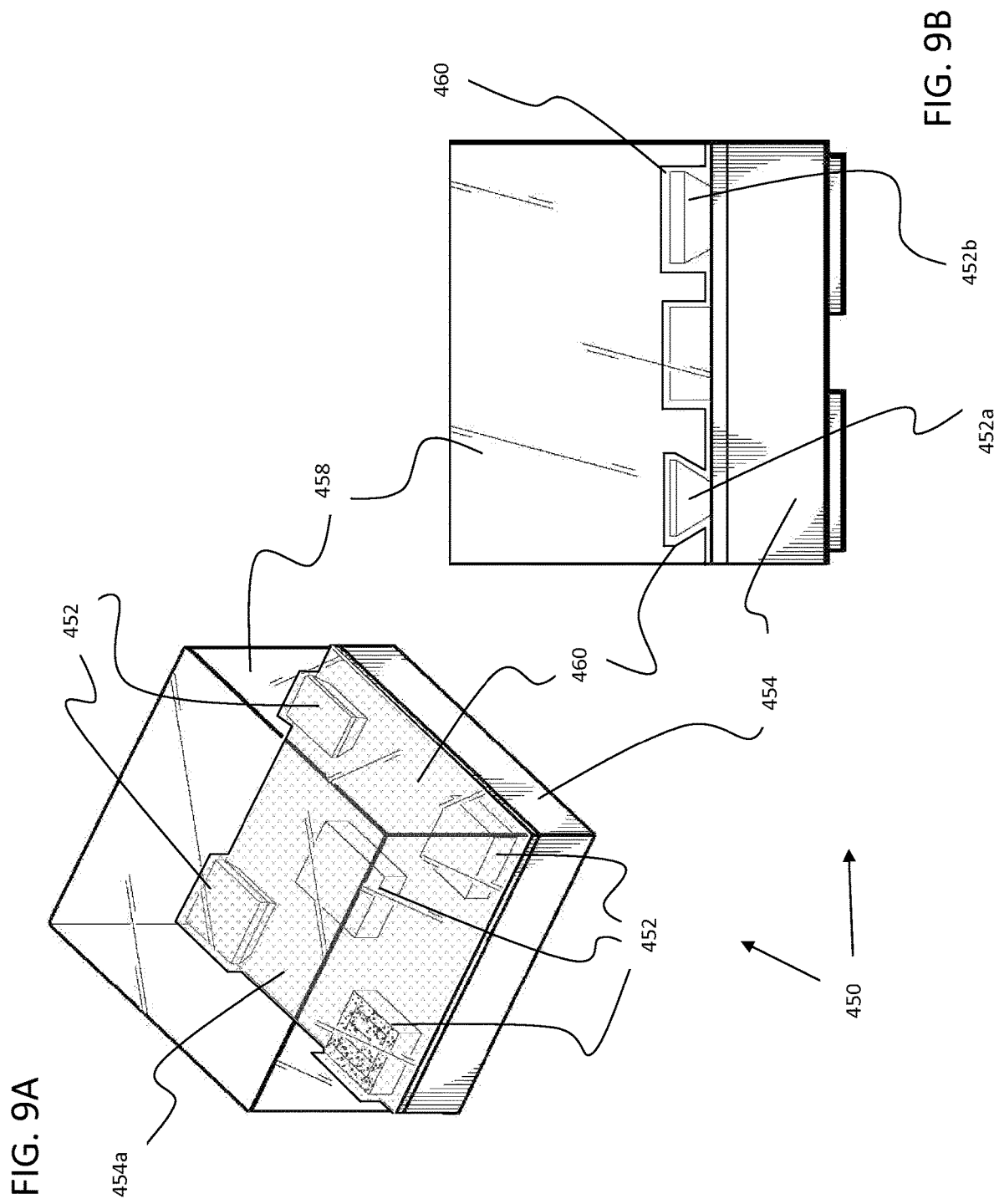

LED PACKAGES WITH CHIPS HAVING INSULATED SURFACES

BACKGROUND OF THE INVENTION

Field of the Invention

This invention pertains to solid state light emitters and in particular to light emitting diode (LED) packages having emitters with exposed surfaces covered by an insulator.

Description of the Related Art

Incandescent or filament-based lamps or bulbs are commonly used as light sources for both residential and commercial facilities. However, such lamps are highly inefficient light sources, with as much as 95% of the input energy lost, primarily in the form of heat or infrared energy. One common alternative to incandescent lamps, so-called compact fluorescent lamps (CFLs), are more effective at converting electricity into light, but require the use of toxic materials which, along with its various compounds, can cause both chronic and acute poisoning and can lead to environmental pollution. One solution for improving the efficiency of lamps or bulbs is to use solid state devices, such as light emitting diodes (LED or LEDs), rather than metal filaments, to produce light.

Light emitting diodes generally comprise one or more active layers of semiconductor material sandwiched between oppositely doped layers. When a bias is applied across the doped layers, holes and electrons are injected into the active layer where they recombine to generate light. Light is emitted from the active layer and from various surfaces of the LED.

In order to use an LED chip in a circuit or other like arrangement, it is known to enclose an LED chip in a package to provide environmental and/or mechanical protection, color selection, light focusing and the like. It is understood that the term "LED" can be used herein to refer to an LED chip, an LED package, or both, and in some instances "LED chip" and "LED package" can be used interchangeably. An LED package can also include electrical leads, contacts or traces for electrically connecting the LED package to an external circuit. One embodiment of an LED package 10 is shown in FIGS. 1A and 1B. The package 10 includes an emitter 12 mounted on two conductive traces 16a,16b which provide a current to the emitter. The emitter can include a silicon carbide (SiC) substrate. The traces 16a,16b are themselves on a submount 14. The emitter 12 is then covered by a lens 18, which may provide environmental and mechanical protection while also acting as an optical element.

Emitters such as the emitter 12 in the package 10 of FIGS. 1A and 1B can be coated by conversion material comprising one or more phosphors, with the phosphors absorbing at least some of the LED light. The emitter 12 can emit a different wavelength of light such that it emits a combination of light from the LED and the phosphor, such as a white-light combination of blue light from the LED and yellow light from the phosphor. The LED chip(s) can be coated with a phosphor using many different methods, with one suitable method being described in U.S. patent application Ser. Nos. 11/656,759 and 11/899,790, both to Chitnis et al. and both entitled "Wafer Level Phosphor Coating Method and Devices Fabricated Utilizing Method". Alternatively, the LEDs can be coated using other methods, such as electrophoretic deposition (EPD), with a suitable EPD method described in U.S. patent application Ser. No. 11/473,089 to Tarsa et al. entitled "Close Loop Electrophoretic Deposition of Semiconductor Devices". In another alternative, the wavelength converting material is included in the lens instead of coated on the LED chip.

UL Standards are a group of industry standards which, according to the Underwriters Laboratories, are "used to assess products; test components, materials, systems and performance; and evaluate environmentally sustainable products, renewable energies, food and water products, recycling systems and other innovative technologies" (see http://ulstandards.ul.com/about). ANSI/UL 8750 "Safety Standard for Light Emitting Diode (LED) Equipment for Use in Lighting Products", commonly referred to as "UL 8750", is a group of LED safety standards. UL 8750 is incorporated by reference herein in its entirety, including supplements to this standard. LED devices similar to the package 10 are assigned an enclosure rating or "class," with higher class numbers being desirable because they enable the use of cheaper, more efficient materials at the fixture level (i.e., in a device having components other than emitter packages, such as secondary optics). For example, keeping all other elements equal, a class 4 component can result in significant cost savings and/or lumen per watt increases of 5-10% due to the other system components that can be used if the LED package itself has a class 4 enclosure rating. As one example, acrylic can be used in a fixture instead of polycarbonate; acrylic is both cheaper and has better optical properties.

In order to achieve a class 4 rating, a package must either 1) have high lens adhesion so as to prevent the lens from being inadvertently knocked off (thus preventing the exposure of electrically active components), or 2) must be designed such that if the lens is removed, all contactable surfaces are electrically inactive. In order to meet the first test, a lens (or encapsulant) must withstand a force of 30N (~6.75 lbs) applied for five seconds (as per supplement SA8.3). In order to meet the second test, any conduction between the exposed emitter surface (in the case of the emitter 12, the SiC substrate) and an electrically active lead cannot take place through the chip or via arcing at a bias of 500 VAC or 710 VDC for 60 seconds. The test to determine passage or failure can be a standard hi-pot test using a manual probe. In practice, the manual probe must be applied with a certain amount of force, such as about 1 lbf. In addition to its electrical wherewithal, an insulator must also be able to withstand this physical force. Some prior art coatings, such as simple phosphor coatings without binder or brittle coatings, will physically fail. This can cause the device to failure the UL 8750 shear force test and the secondary electrical hi-pot test, since the probe may no longer be on a sufficiently insulating surface.

SUMMARY OF THE INVENTION

The present invention is generally directed to emitter or LED packages that include an insulating layer on and/or covering an emitter.

One embodiment of an emitter package according to the present invention can comprise an emitter on a submount, an encapsulant on the emitter, and an electrically insulating layer between the emitter and the encapsulant.

Another embodiment of an emitter package according to the present invention can comprise an emitter on a mount surface with a first insulating layer on the emitter and a second insulating layer on the mount surface, where the first insulating layer can comprise a dielectric.

One embodiment of an emitter component according to the present invention can comprise a substrate with first and second opposing faces with a diode region on the first face of the substrate. First and second contacts can be on the first face with the diode region therebetween, and an insulating layer can be on the second face.

One embodiment of a method for forming an emitter package according to the present invention can comprise mounting an emitter on a mount surface such that the emitter diode region is between the mount surface and the emitter's substrate. A transparent insulating layer can then be deposited on the emitter.

These and other aspects and advantages of the invention will become apparent from the following detailed description and the accompanying drawings which illustrate by way of example the features of the invention.

BRIEF DESCRIPTION OF THE DRAWINGS

FIGS. 5A and 5B are perspective and sectional views of one embodiment of an emitter package according to the present invention;

FIGS. 7A and 7B are perspective and sectional views of one embodiment of an emitter package according to the present invention;

FIGS. 8A and 8B are perspective and sectional views of one embodiment of an emitter package according to the present invention;

FIGS. 9A and 9B are perspective and sectional views of one embodiment of an emitter package according to the present invention;

DETAILED DESCRIPTION OF THE INVENTION

Figure 1A:
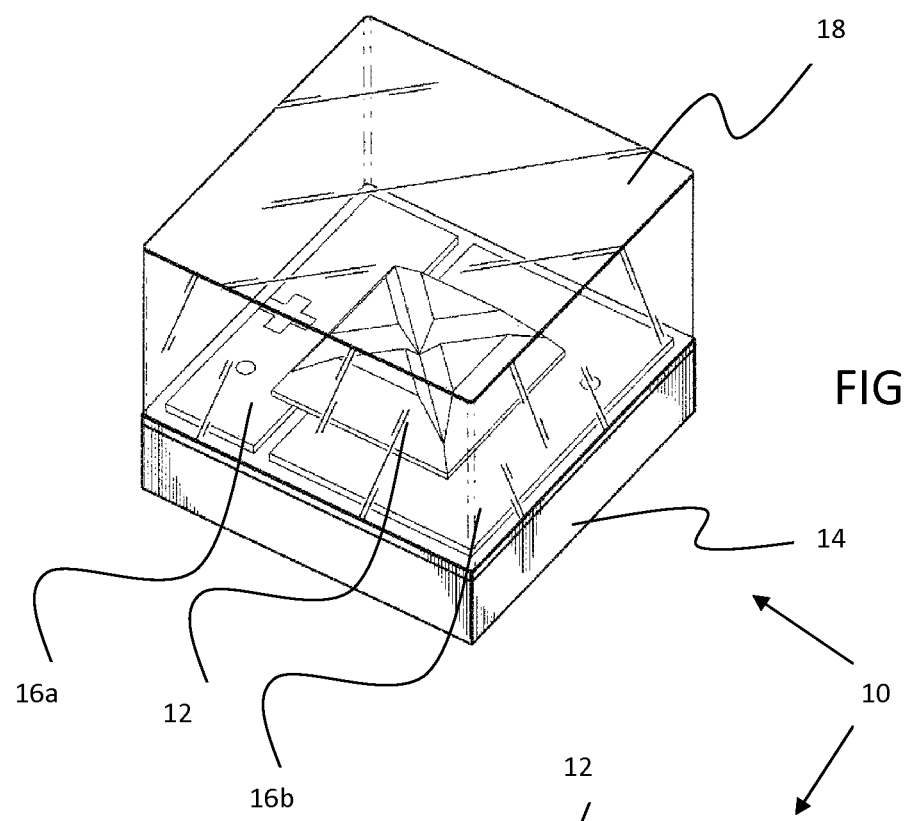
FIGS. 1A and 1B are perspective and side views of an emitter package.
Figure 1B:
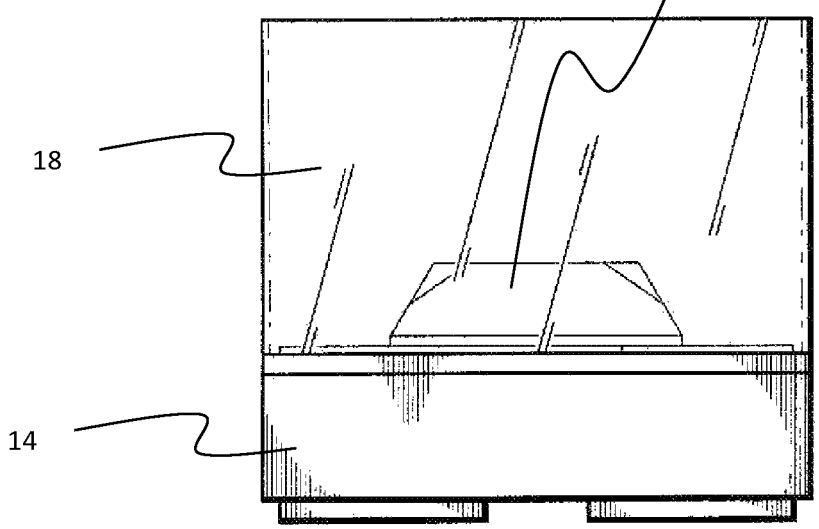

The present invention is directed to different embodiments of emitter packages which can include no electrically active components exposed should the package lens be removed for any reason. UL 8750, an industry standard providing fire and safety ratings for components, requires either 1) a certain lens adhesion, or 2) the insulation of any electrically active components should the lens be removed, in order to achieve a class 4 rating. A class 4 rating on the component/package level means that any fixture using only class 4 packages need not worry about enclosure ratings with respect to other components, such as secondary optics. This can result in large cost and/or efficiency savings, since non-package components used on the fixture level can be cheaper, more optically efficient, or both.

All embodiments and concepts described herein can be applied to packages or devices that fail the first UL8750 class 4 test (e.g., packages or devices that experience lens failure at a force of 30N applied for less than five seconds). In particular, smaller packages have lower lens adhesion than larger components, which means that the lens is more susceptible to being sheared off of the package submount. So long as an emitter comprising an insulating substrate is flip-chip mounted on the submount, and no other electrically active surfaces are present, a component can achieve a class 4 rating. However, modern technology has shown that substrates that are not completely insulating—such as silicon carbide, for example—have some distinct advantages over insulating substrates such as sapphire, and thus can be desirable.

Each embodiment herein can include an insulator and/or insulating layer that can be retained on the emitter and/or other surfaces should the encapsulant/lens be removed or sheared off, such as if the package were to fail the first UL8750 class 4 test. For example, an insulating layer according to the present invention can be retained or substantially retained on the remainder of the package should an encapsulant/lens be removed in any way. In one example, insulating layers according to the present invention can remain on the remainder of the package when an encapsulant is removed due to—and thus does not withstand—a force (e.g. a shear force) of 30N or more applied for five seconds or less. This can be so for any number of reasons, including but not limited to the fact that the adhesion on the emitter-side (e.g., adhesion between insulator and emitter substrate) can be greater than adhesion on the lens-side (e.g., adhesion between the insulator and the encapsulant). The emitter-side adhesion of the insulating layer can also be greater than the adhesion on the lower edge of the encapsulant (e.g., the lens-emitter interface) in an equivalent package lacking said insulating layer. Because the insulator can be retained on the remainder of the package, it can prevent shock and/or neutralize a fire hazard, goals of the UL8750 rating system.

The present application describes packages having insulated surfaces and methods for forming these packages. In one particular embodiment, an emitter having a conductive or semi-conductive, non-fully-insulating substrate (e.g., SiC) that is mounted diode-region-down on a submount (e.g., a horizontally-aligned flip-chip arrangement) can include a relatively thin layer of insulating material coated on the substrate surface. Including this material can prevent current from flowing through the substrate to electrically active components below, such as traces.

Other layers can also be included in embodiments of the present invention. For example, an insulating solder mask or other type of layer can be included on other surfaces of the submount, including covering electrically active traces on the submount. In addition to insulating electrically active surfaces as required for the class 4 rating, this layer can be reflective so as to contribute to reemission of light that is internally reflected. Another possible layer is a phosphor layer that can be included, for example, on top of the submount and/or on top of the insulating reflective layer. This layer can assist in converting the necessary portion of light emitted by the emitter.

The present invention is described herein with reference to certain embodiments, but it is understood that the invention can be embodied in many different forms and should not be construed as limited to the embodiments set forth herein. In particular, the present invention is described below in regards to certain LED packages having LEDs in different configurations, but it is understood that the present invention can be used for many other LED packages with other LED configurations. The LED packages can also have many different shapes beyond those described below, such as rectangular, and the solder pads and attach pads can be arranged in many different ways. In other embodiments, the emission intensity of the different types of LED chips can be controlled to vary the overall LED package emission.

The present invention can be described herein with reference to conversion materials, wavelength conversion materials, remote phosphors, phosphors, phosphor layers and related terms. The use of these terms should not be construed as limiting. It is understood that the use of the term phosphor or phosphor layer is meant to encompass and be equally applicable to all wavelength conversion materials.

The components herein can have different shapes and sizes beyond those shown, and one or different numbers of LEDs can be included. It is also understood that the embodiments described below utilize co-planar light sources, but it is understood that non co-planar light sources can also be used. It is also understood that an LED light source may be comprised of multiple LEDs that may have different emission wavelengths. As mentioned above, in some embodiments at least some of the LEDs can comprise blue emitting LEDs covered with a yellow phosphor along with red emitting LEDs, resulting in a white light emission from the LED package. In multiple LED packages, the LEDs can be serially interconnected or can be interconnected in different serial and parallel combinations.

It is also understood that when a feature or element, such as a layer, region, encapsulant or submount may be referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances, and a region described as "conformal" or "uniform" should be understood to have at least some sort of nonconformalness or uniformity due to manufacturing limitations. Thus, the regions illustrated in the figures are schematic in nature and their shapes are not intended to illustrate the precise shape of a region of a device and are not intended to limit the scope of the invention.

Figure 2A:
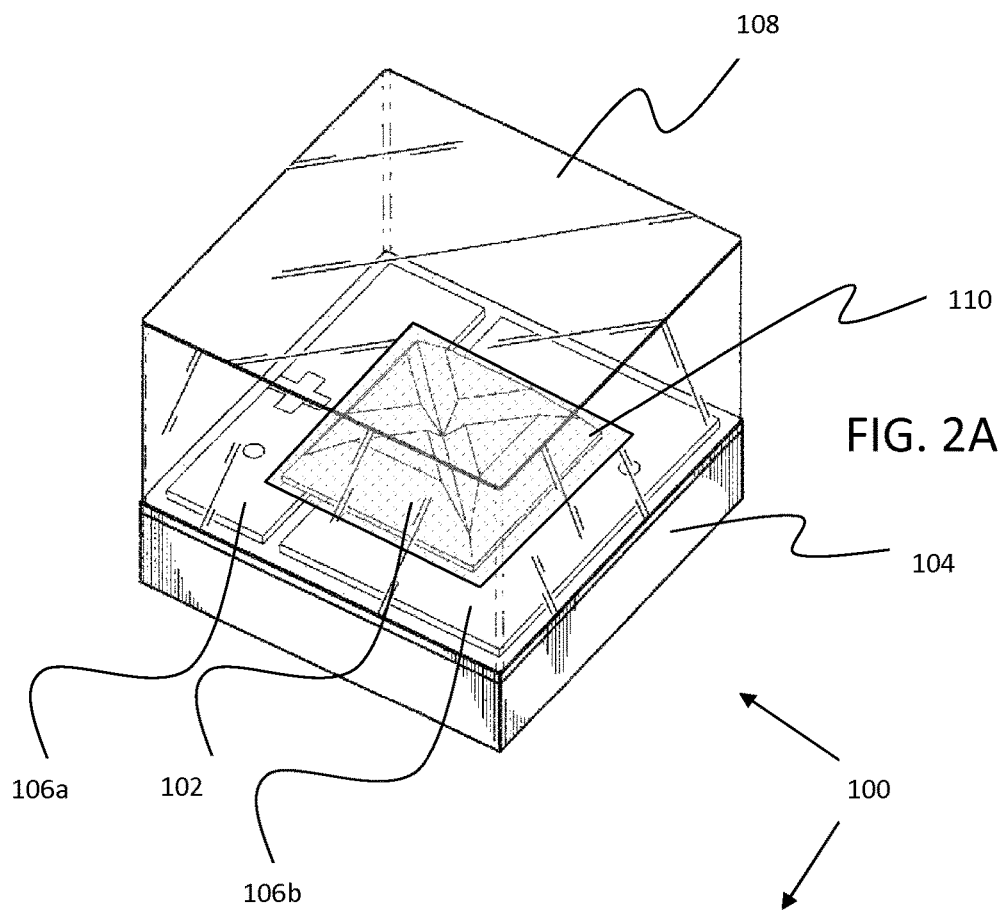
FIGS. 2A-2C are perspective, side, and sectional views of one embodiment of an emitter package according to the present invention.
Figure 2B:
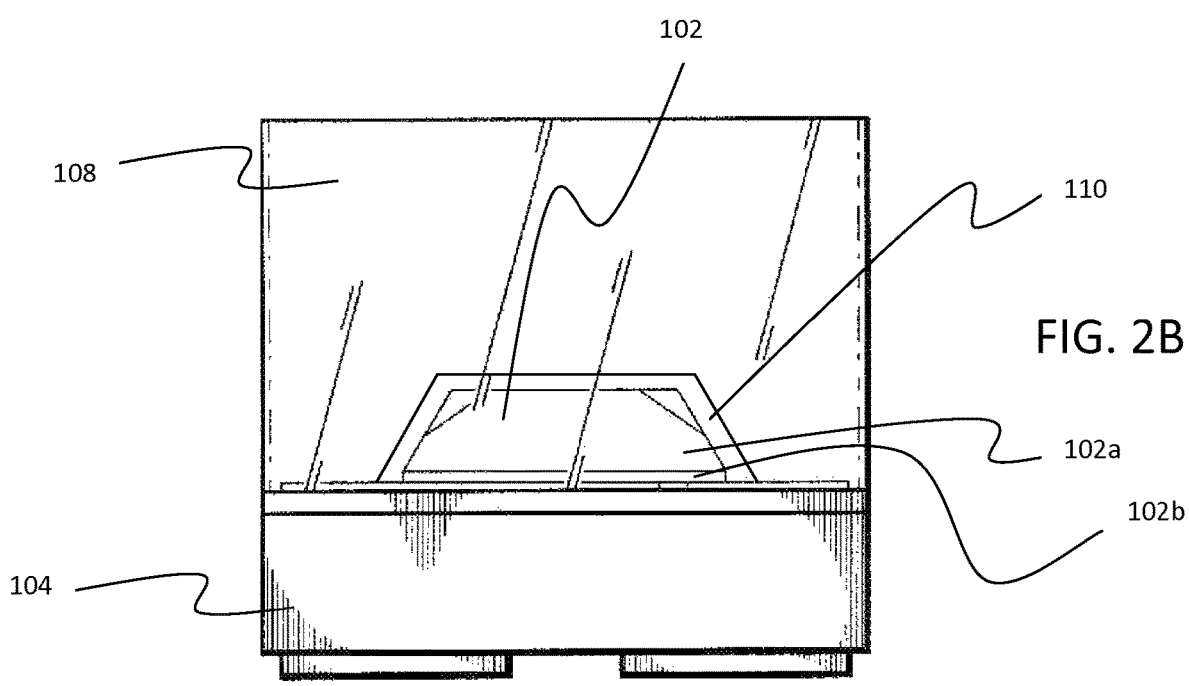
Figure 2C:
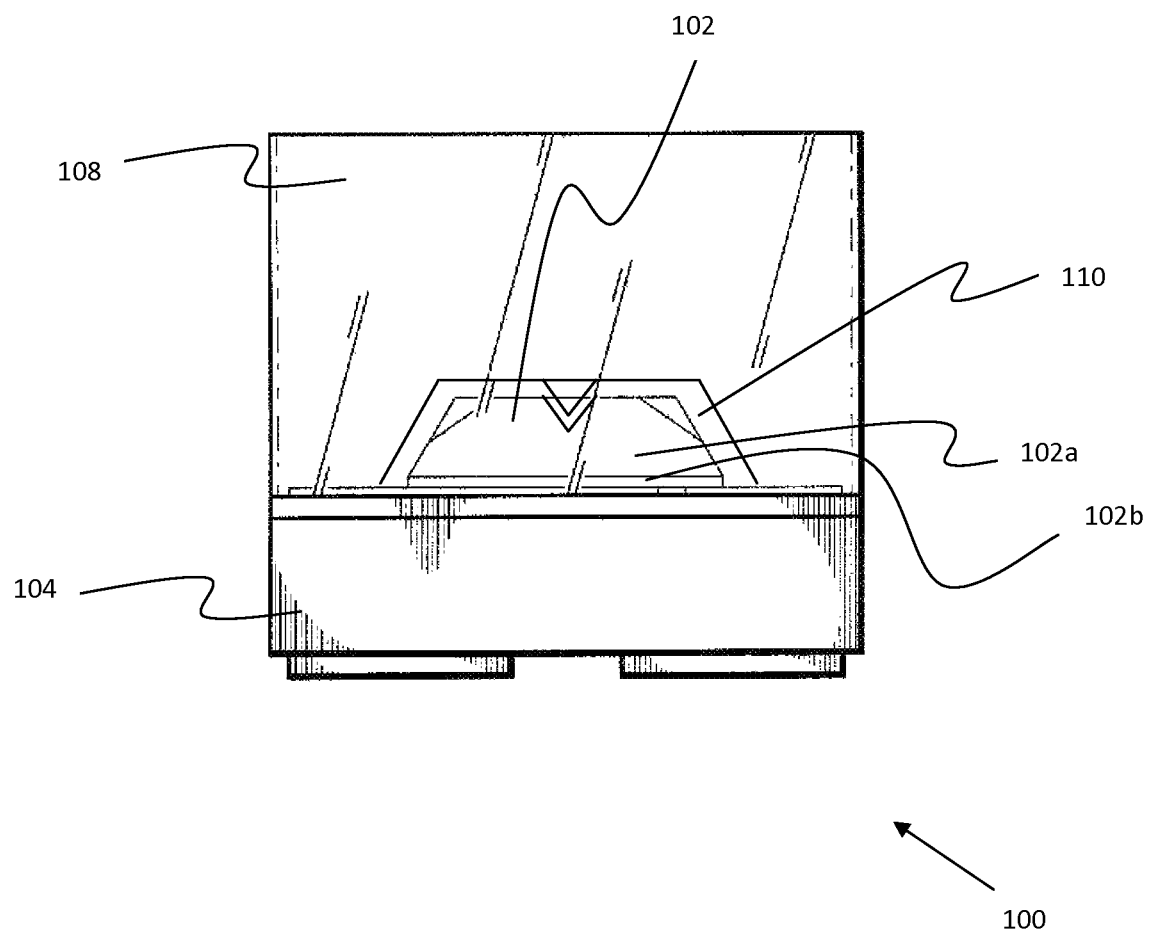

FIGS. 2A-2C shows one embodiment of an emitter package 100 according to the present invention. The emitter package 100, as with all packages shown hereafter, can be designed to achieve a UL 8750 class 4 rating (and/or any other relevant or similar ratings) while minimizing any negative effect on device output. The package 100 can include standard LED package components such as an emitter 102, a submount 104, one or more conductive traces 106, and a lens 108. In this case, the emitter 102 is direct-attached and/or flip-chip mounted on two conductive traces 106a,106b, although other embodiments are possible. A wavelength conversion material can be included in many different manners, with some examples being a conversion material on the emitter 102 with or without a binder, distributed in the lens, and/or as will be described below with regard to FIGS. 7A and 7B, for example.

The emitter 102 can include a substrate 102a, which in this case can form the primary emission surface. The diode region 102b of the emitter 102 (e.g. n-type, p-type, and light-emitting layers) and any other epitaxial and/or contact layers to the semiconductor layers can be between the substrate 102a and the traces 106a,106b.

Commonly assigned U.S. patent application Ser. No. 13/758,565 to Donofrio et al. and entitled "Light Emitting Diodes Including Light Emitting Surface Barrier Layers, and Methods of Fabricating Same", which is fully incorporated by reference herein in its entirety, describes the use of a layer of SiN directly on a light emitter on the system level including a sealed environment. This SiN layer can be used as a "carbon blocking layer" in sealed environments where outside gases such as oxygen cannot penetrate the system. This layer can prevent discoloration and/or charring which can cause both aesthetic and optical difficulties.

In some embodiments, the present invention is directed to the use of insulating materials as electrical insulators in an instance where a lens or encapsulant, which can provide a non-sealed and/or permeable environment, are removed or removable. These and other embodiments can be directed toward the component level as opposed to the system level. The component can then be used in any system. The insulating materials can include dielectrics such as SiN and/or SiO2, and/or can include nondielectrics. In some embodiments, the insulating layer(s) should have sufficient thickness to provide sufficient electrical isolation, as opposed to simply acting as a physical barrier. In some cases, the package 100 may not have sufficient lens adhesion to pass the adhesion portion of the class 4 test. For example, the package 100 may be relatively small, such as 1 mm×1 mm, 1.6 mm×1.6 mm, ≤2 mm by ≤2 mm, ≤5 mm×≤5 mm, and/or ≤10 mm×10 mm. Small packages typically have less lens adhesion. Some examples or small LED packages are the XLamp XQ-B and XLamp XQ-D from CREE, INC., the data sheets of which are fully incorporated by reference herein in their entirety. Many different small packages are possible.

The package 100 can instead be designed to pass the class 4 hi-pot test. If an insulating substrate such as sapphire is used, then the emitter portion of the component can pass the UL 8750 class 4 test without further components or processing. However, many modern substrate materials, including but not limited to materials not necessarily designed or used for their conductive properties, are at least somewhat conductive. For example, SiC substrates offer numerous advantages over insulating substrates such as sapphire, such as a better lattice match with semiconductor layers grown thereon, but will often fail the class 4 hi-pot test.

The package 100 can include an insulating layer 110. It is understood that all similarly positioned insulating layers described hereafter can have the properties described with regard to the insulating layer 110. The insulating layer 110 can be on and/or directly on some or all of the exposed surface of the emitter 102, including some or all of the exposed surface of the substrate 102a. The insulating layer 110 can be a coating or film, for example. The insulating layer 110 can be made of a material that is substantially transparent to the wavelength(s) of light emitted by the emitter 102. In one embodiment, the insulating layer 110 is a dielectric material or combination of dielectrics such as $SiO_2$ and/or SiN, although many different dielectrics are possible. In another embodiment the insulating layer 110 is $TiO_2$. In yet another embodiment the insulating layer 110 is a parylene polymer. In yet another embodiment the insulating layer 110 includes silicone and/or phosphor. Many different materials are possible. Combinations of the above, including but not limited to combinations of multiple layers having different contents, are possible, such as the combination of one or more dielectric sublayers and a phosphor/binder (e.g., phosphor/silicone) sublayer.

The insulating layer 110 can have a variety of thicknesses depending on its insulative properties. Typically, the lower the thickness, the less light will be absorbed by the insulating layer. In one embodiment, the thickness of the insulating layer 110 is greater than about 5000 A and/or between about 5000 A and about 5 μm. In other embodiments, the thickness is about 1 μm or greater, about 2 μm or greater, about 5 μm or less, about 1 μm to about 3 μm, and/or about 2 μm. In one such embodiment, the insulating layer 110 includes about 1 μm of dielectric material (e.g., $SiO_2$ and/or SiN) and a phosphor/silicone layer. Exemplary phosphor/silicone layer thicknesses are between 60 μm and 150 μm, or about 100 μm, although many different thicknesses are possible. In another embodiment, the insulating layer 110 includes about 2 μm or more of a dielectric material (e.g., $SiO_2$ and/or SiN). In another embodiment, the insulating layer 110 includes about 3 μm or more, about 4 μm or more, or about 4 μm to about 5 μm of parylene. If properly designed, these layer thicknesses can result in 1 μmen per watt losses of 5% or less, 3% or less, and/or about 1% or less compared to a similar package without such a layer. In some instances, an antireflective coating can be used which can result in 0% loss or enhanced extraction.

The above examples have also been shown to be able to withstand a typical class 4 hi-pot probe force of 1 lbf. The brittleness of the insulating layer 110 can be minimized by controlling temperature, pressure, and deposition rates, for example, resulting in a physically strong layer. As previously mentioned, the emitter-side interface of the insulating layer 110 and other insulating layers described herein can have better adhesion than the lens-side interface. The insulating layer 110 can be retained when one or more elements above it—such as the encapsulant or lens 108—are removed, thus preventing a potential shock and/or fire hazard.

The insulating layer 110 and other insulating layers described herein can include additives of many different kinds, such as, for example, wavelength converting particles and/or scattering particles as are known in the art.

In the embodiment shown in FIGS. 2A-2C, the insulating layer 110 can be conformal to the substrate 102a, as best seen in FIG. 2C. The thickness of the insulating layer 110 over the substrate 102a can be approximately uniform, defined herein as ±10% of the design or average thickness. In a conformal coating, the top surface of the coating layer (e.g. the insulating layer 110) can substantially follow the contours of the coated element (e.g. the emitter 102 and/or substrate 102a). Use of a conformal and/or uniform coating can result in a more uniform output from the emitter 102. In one example of a package according to the present invention, a conformal coating can be applied to a DA1000 LED chip from CREE, INC., the data sheet of which is fully incorporated herein by reference in its entirety. Many other types of chips can be used, including but not limited to the DA700, DA2432, and DA3547 chips from CREE, INC., the data sheet of each of which is fully incorporated by reference herein. The DA1000 includes a SiC substrate with a series of angled or beveled surfaces as its primary emission surface. A conformal coating according to one embodiment of the present invention can remain approximately at the same thickness within these subtractive areas as outside them, as shown in FIG. 2C.

As previously described, embodiments of the present invention can be designed such that all electrically active surfaces are insulated. While the embodiment of FIGS. 2A-2C shows traces that extend outside the footprint of the emitters, any of the embodiments herein described can include traces which are insulated in one or more of a number of different manners. For example and as will be described below, the traces can be covered with an insulating material, such as a solder mask for example. In other embodiments, a package can include one or more traces which are completely under one or more emitters and thus are not exposed on the submount's surface. Many different insulating devices, arrangements, and methods are possible, some of which will be described in detail below.

Figure 3A:
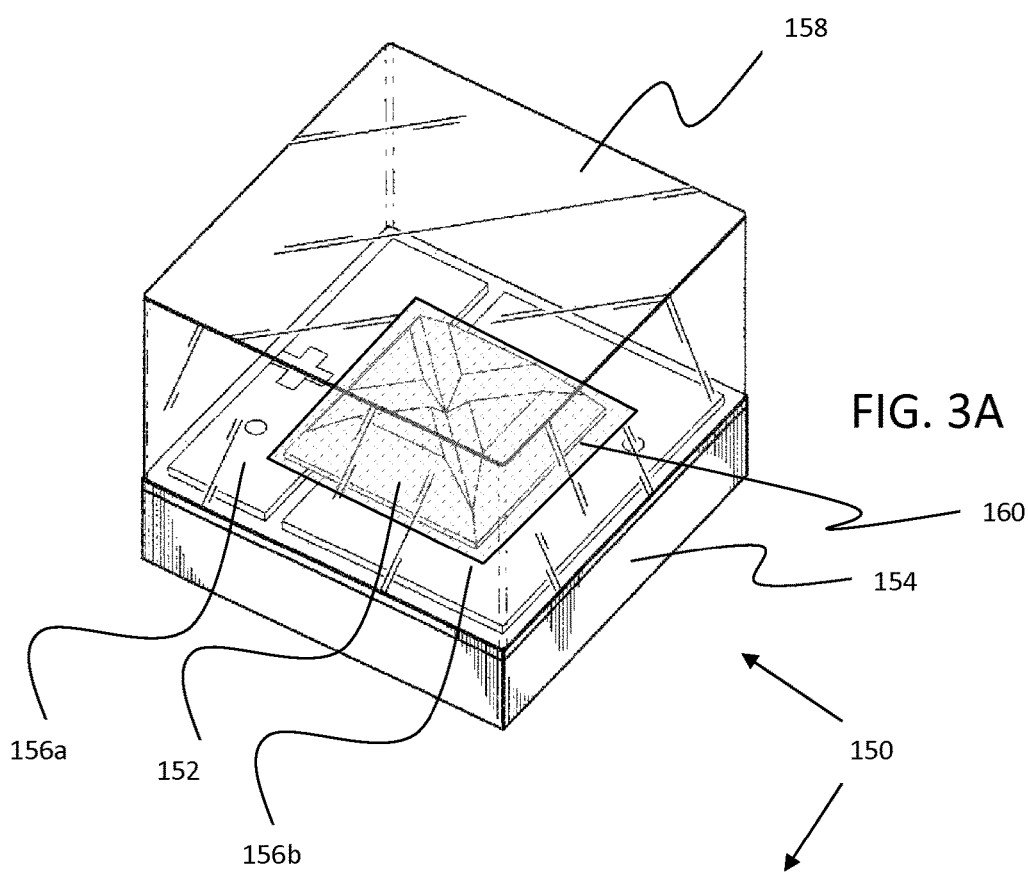
FIGS. 3A-3C are perspective, side, and sectional views of one embodiment of an emitter package according to the present invention.
Figure 3B:
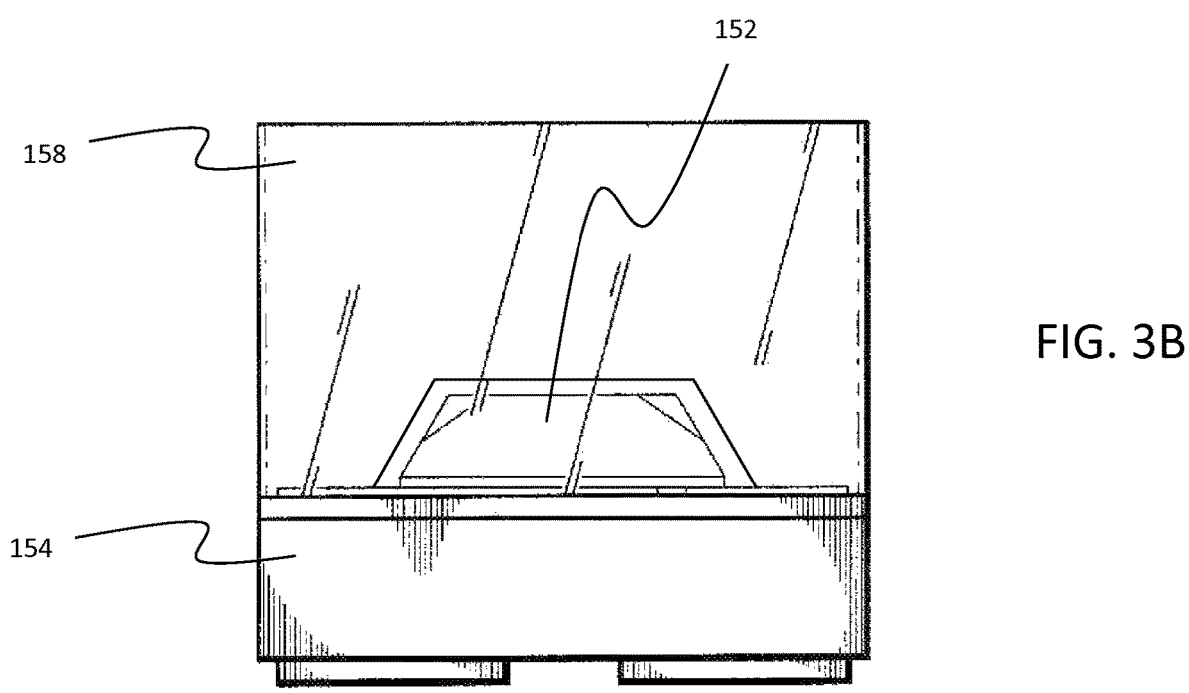
Figure 3C:
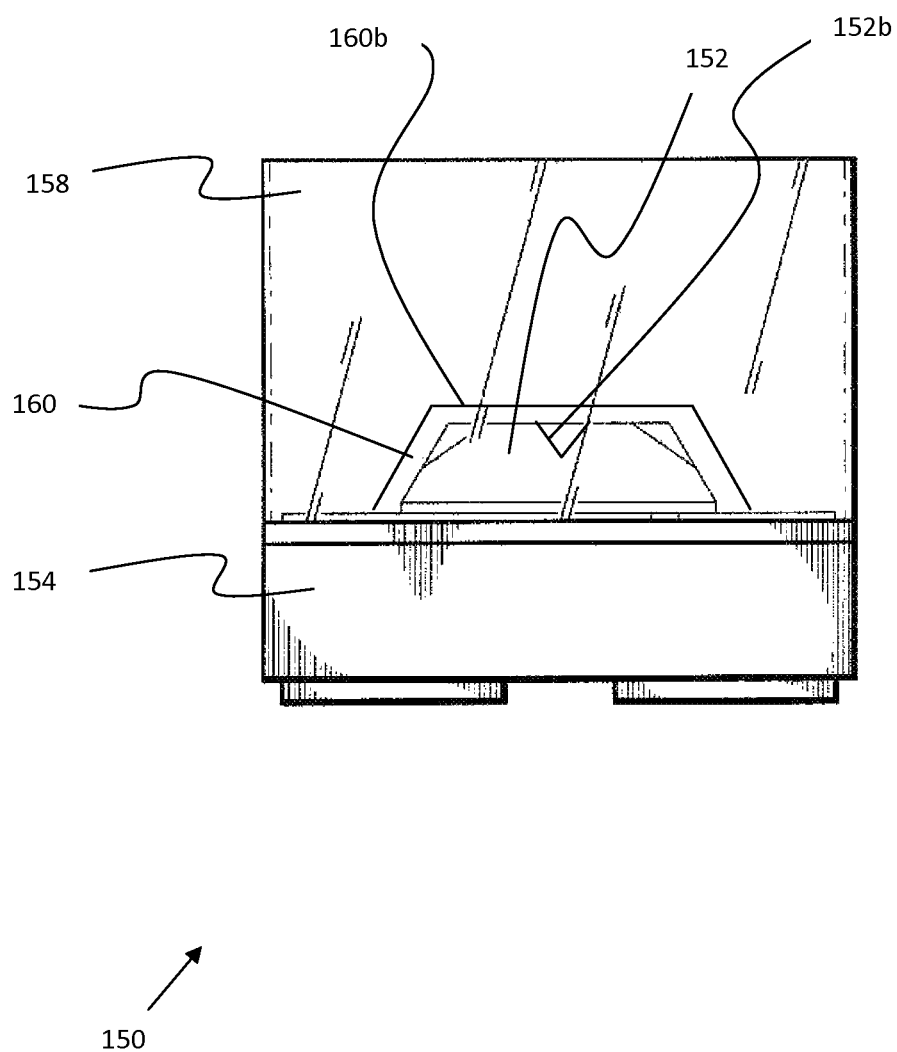

In other embodiments, the insulating layer 110 can be formed so as to have one or more planar surfaces, such as a planar top surface (note that if the top surface of the emitter is also planar, then such a coating would also be conformal). For example, FIGS. 3A-3C show a package 150 according to the present invention that can include an emitter 152 with a nonplanar top surface 152b. The package 150 can include an insulating layer 160 similar to or the same as the insulating layer 110. However, the insulating layer 160 can form a planar or substantially planar top surface 160b over the surface 152b. Some such embodiments can have reduced manufacturing complexity and costs.

Figure 4A:
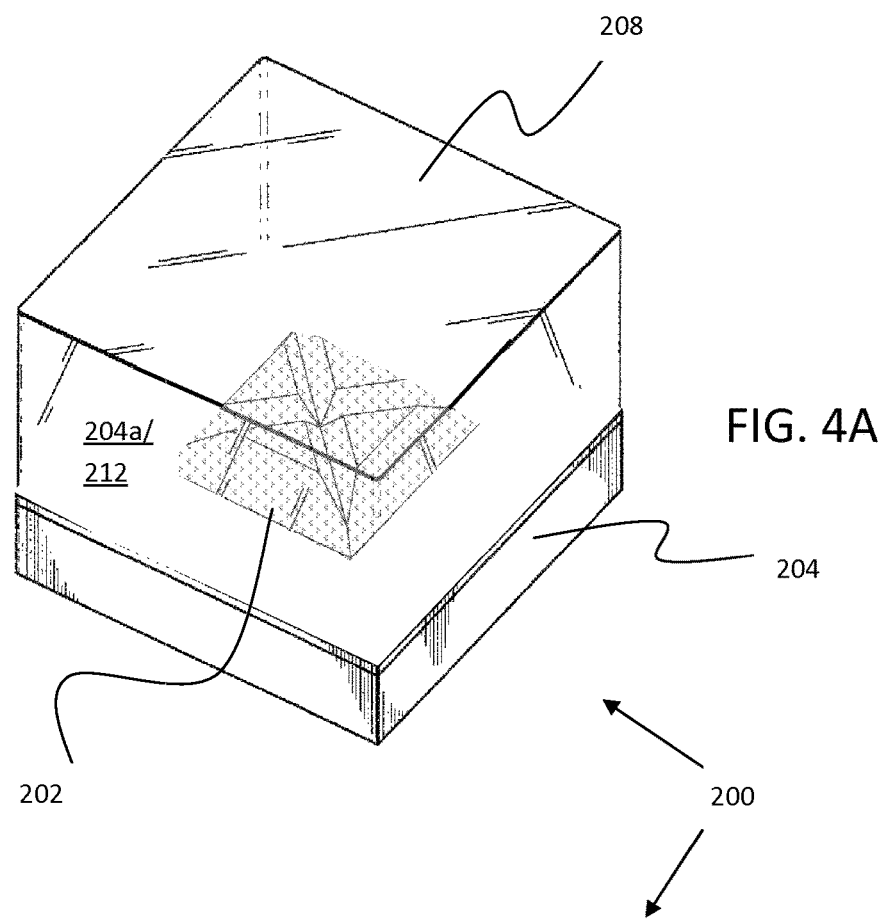
FIGS. 4A-4C are perspective, side, and sectional views of one embodiment of an emitter package according to the present invention.
Figure 4B:
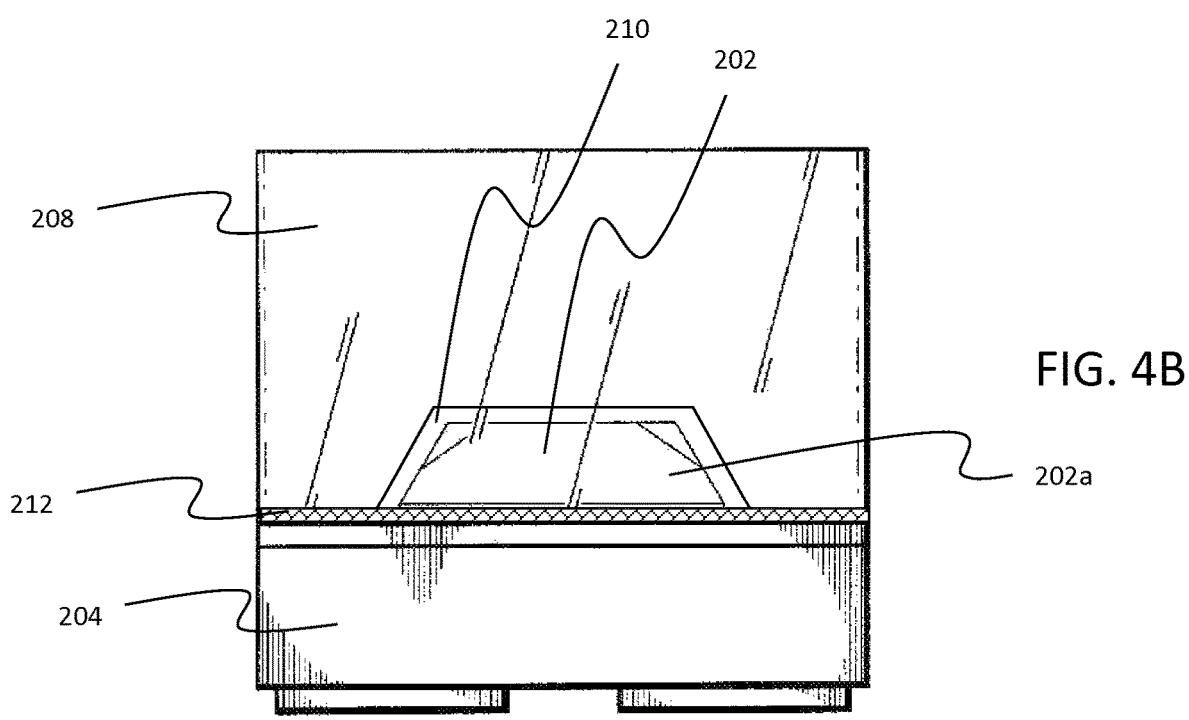
Figure 4C:
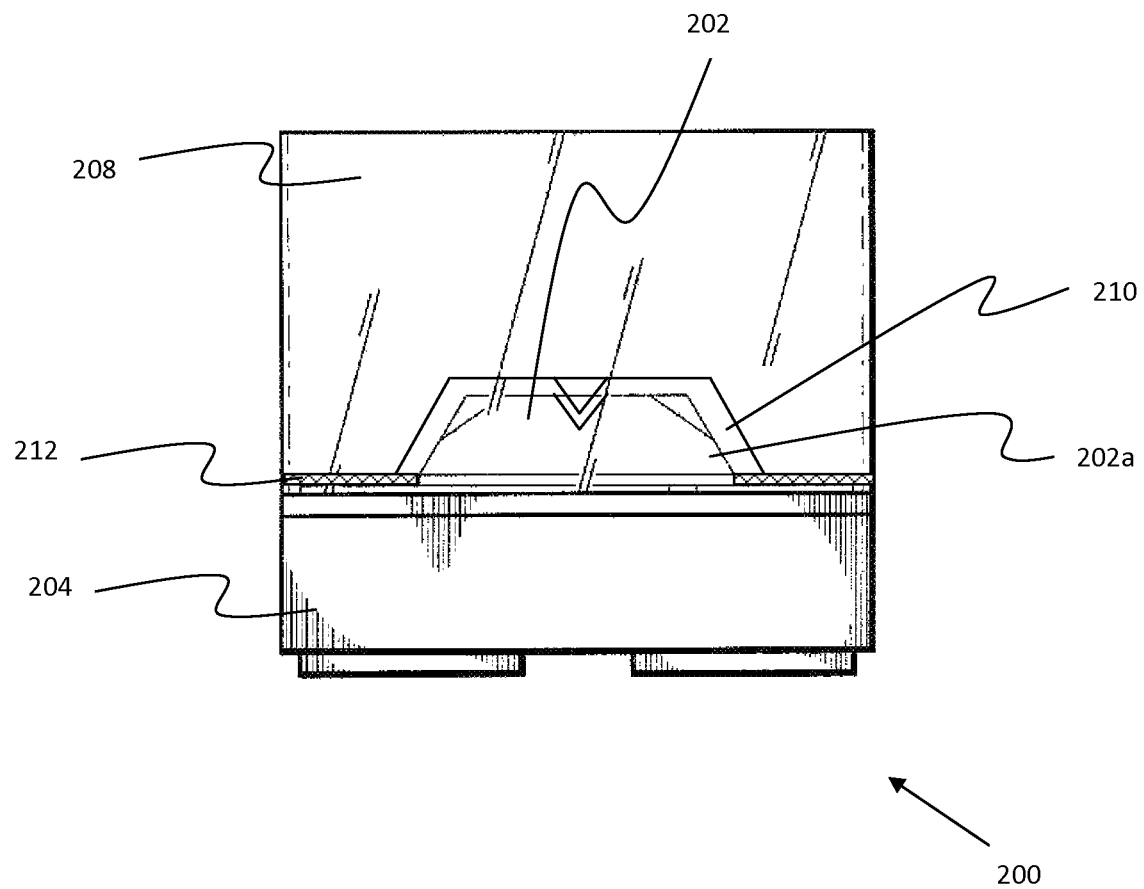

Insulating layers such as those described above can be used in many different embodiments of the present invention, including all of those described hereafter. FIGS. 4A-4C show another embodiment of a package 200 according to the present invention which can include an insulating layer 210 similar to the insulating layer 110 from FIGS. 2A-2C. The package 200 can also include an emitter 202, a submount 204, traces, and a lens/encapsulant 208. Additionally, the package 200 can include a second insulating layer 212. The second insulating layer 212 can be reflective, and as such will be referred to herein as a reflective insulating layer 212, although this description should not be construed as limiting. The reflective insulating layer 212 and similar layers can come in the form of a solder mask and/or can cover some or all of the area outside of the footprint of the emitter, sometimes prior to the mounting of the emitter(s). Such methods will be discussed in detail below.

While the insulating layer 210 can serve to insulate the surfaces of the emitter 202 and substrate 202a should the lens 208 be removed, in order to meet UL 8750 class 4 standards the other exposed surfaces of the package must also not be electrically active. The reflective insulating layer 212 can serve to insulate these other surfaces and/or can serve to enhance light extraction. In the embodiment shown, the reflective insulating layer 212 can cover substantially all the top surface 204a of the submount 204 outside the footprint of the emitter 202. This can include the surfaces of the electrically active traces. In another embodiment, the surfaces of the traces are covered and less than the entirety of the top submount surface 204a is covered; in one such embodiment, the reflective insulating layer 212 covers substantially just the traces. In some embodiments, the top surface 204a can be reflective.

As discussed above, the reflective insulating layer 212 can be reflective. In one embodiment, the layer 212 comprises a diffuse reflective material and/or a white material, such as a white paint or coating. Some exemplary materials are available from WhiteOptics, LLC, of New Castle, Del. One exemplary product is the White96 Advanced Coating, which is designed to be 96% or more reflective, although many different products are possible. In another embodiment the layer can be specular.

Many different thicknesses are possible for the reflective insulating layer 212. In one embodiment, the layer 212 is about 25 µm to about 75 µm. In another embodiment, the layer 212 is about 50 µm thick. Many other thicknesses are possible.

The use of a reflective material for the reflective insulating layer 212 can result in enhanced emission. For example, light that is internally reflected at the lens/ambient surface back into the lens may encounter the top surface 204a of the submount 204. By including a reflective material, this light can be reflected back toward the ambient and have another chance at emission. In other embodiments, a wavelength conversion material can be included on the surface 204a, whether by itself or in addition to the reflective material. This will be discussed in detail below with regard to FIGS. 7A and 7B. The above concepts can be referred to as "photon recycling," which is discussed in detail in commonly assigned U.S. patent application Ser. No. 13/770,389 to Lowes et al. and entitled "LED Package with Multiple Element Light Source and Encapsulant having Planar Surfaces," which is fully incorporated by reference herein in its entirety.

The thickness of the reflective insulating layer 212 can depend on many different factors including its insulative properties. In some embodiments, the layer is approximately 10 µm to approximately 500 µm, or about 150 µm, although many different thicknesses are possible.

FIGS. 5A and 5B show a package 250 according to another embodiment of the present invention. The package 250 can include an emitter 252, submount 254, traces 256a,256b, and lens 258. The package 250 may not include a distinct reflective insulating layer such as the layer 212 from FIGS. 4A and 4B. Instead, an insulating layer 260 similar to or the same as the insulating layer 110 from FIGS. 2A-2C can cover both the exposed surfaces of the emitter 252 and any other electrically active surfaces, such as the surfaces of the traces 256. In the embodiment shown, the insulating layer 260 covers substantially all the top surface 254a of the submount 254 including the traces 256, although in other embodiments it covers less than all the top surface 254a.

The package 250 can still have an emission that is enhanced due to the reflection of internally reflected light. For example, the traces 256a,256b and/or the top surface 254a of the submount 254 can be reflective. For example, the traces 256a,256b can be reflective metal. Because the insulating layer 260 can be substantially transparent to the wavelengths of light being emitted by the package 250, light can pass through the insulating layer 260 and be reflected by the traces 256a,256b and/or the top surface 254. In some embodiments, the traces 256a,256b can cover 50% or more of the top surface 254a of the submount 250 outside the footprint of the emitter 252. In other embodiments, the traces 256a,256b can cover 80% or more of this surface, and in other embodiments can cover 90% or more of this surface.

Figures 6A, 6B:
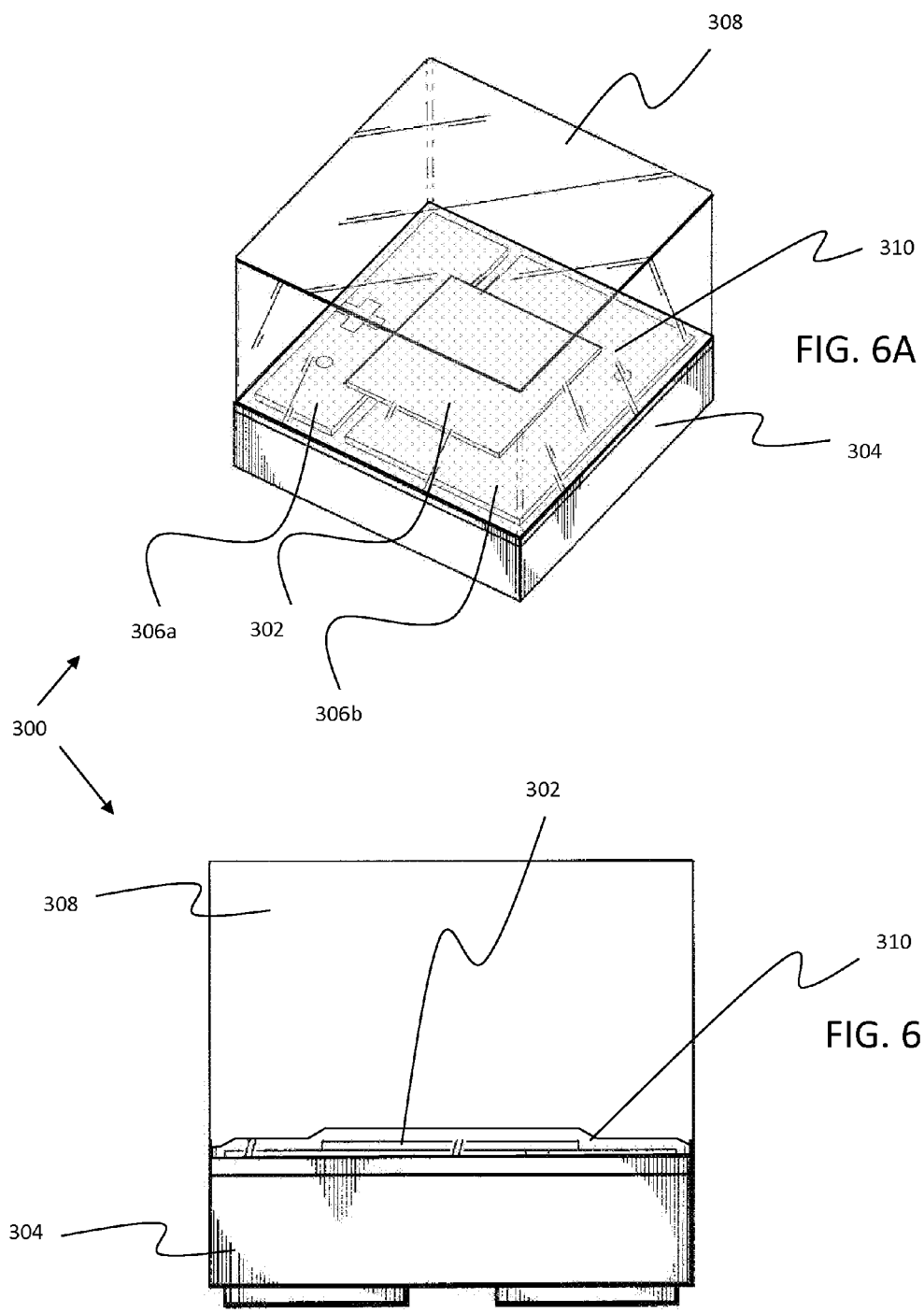
FIGS. 6A and 6B are perspective and sectional views of one embodiment of an emitter package according to the present invention.

FIGS. 6A and 6B show a package 300 according to another embodiment of the present invention. The package 300 can include an emitter 302, submount 304, traces 306a,306b, lens 308, and an insulating layer 310 similar to or the same as the insulating layer 260 from FIGS. 5A and 5B. Although the package 300 is shown without a reflective insulating layer, it is understood that a layer similar to the reflective insulating layer 212 from FIGS. 4A-4C could be included, such as in an embodiment where the insulating layer 310 covers only the exposed surfaces of the emitter 302. The package 300 is similar in many respects to the package 250 from FIGS. 5A and 5B, with an insulating layer 310 covering substantially all of the top surface of the submount 304, although many different embodiments are possible. The primary difference between the packages 300 and 250 is that the substrate of the emitter 302 has been thinned, such as a substrate of 100 µm or less. For comparison, a typical DA 1000 emitter from CREE, INC. can have a substrate of 300 µm to 400 µm, or about 335 µm. The thinning of the substrate can result in enhanced emission as less light will be absorbed by the substrate before passing into the insulating layer 310. Substrate removal and thinning is described, for example, in commonly assigned U.S. Pat. No. 7,932,111 to Edmond and entitled "Substrate Removal Process for High Light Extraction LEDs", which is fully incorporated by reference herein in its entirety. Other substrate removal processes, such as grinding and etching, are known in the art. In some embodiments of the present invention, such as those with vertically oriented emitters as will be described with regard to FIGS. 13A and 13B, the substrate could be completely removed to enhance light extraction even further.

In embodiments of the present invention with emitters not having a substrate or having a reduced substrate, such as the emitter 302, the materials and thickness of the insulating layer can sometimes be the same as described above with regard to the insulating layer 110 from FIGS. 2A-2C. However, in some cases the thickness of the insulating layer may be greater, such as due to the fact that the substrate does not provide any insulation (i.e., the presence of a semi-insulating/semi-conductive substrate in some embodiments may provide at least some insulation and therefore allow for the use of a thinner insulating layer than would otherwise be needed). Insulating layers over a substrateless emitter or an emitter with a thinned substrate, such as the insulating layer 310, can in some embodiments be about 2 µm or greater, in some embodiments about 2 µm to about 3 µm, and/or in some embodiments about 3 µm or greater.

FIGS. 7A and 7B show a package 350 according to another embodiment of the present invention. The package 350 can include an emitter 352, submount 354, traces, and lens 358. The embodiment shown is similar in many respects to the package 200 from FIGS. 4A-4C in that it can include an insulating layer 360 and a reflective insulating layer 362; however, it is understood that the package 350 can include any of the insulating layer arrangements described above with regards to FIGS. 2A-6B or described hereafter. The package 350 can include a wavelength conversion layer 364 that can include wavelength conversion elements such as phosphor, for example. The layer 364 can also comprise a binder, and different materials can be used for the binder, with materials preferably being robust after curing and substantially transparent in the visible wavelength spectrum. Suitable materials include silicones, epoxies, glass, inorganic glass, dielectrics, BCB, polymides, polymers and hybrids thereof. In embodiments where the wavelength conversion layer 364 includes an insulating material such as a dielectric, the insulating layer 360 may not be needed as the wavelength conversion layer 364 can sufficiently insulate the emitter 352. A preferred material is silicone because of its high transparency and reliability in high power LEDs. Suitable phenyl- and methyl-based silicones are commercially available from Dow® Chemical. The binder can be cured using many different curing methods depending on different factors such as the type of binder used. Different curing methods include but are not limited to heat, ultraviolet (UV), infrared (IR) or air curing. Further, it should be understood that phosphor particles can be applied without a binder.

Although other embodiments are possible, in the embodiment shown the wavelength conversion layer 364 covers substantially all of the top surface of the submount 354, including the surfaces of the emitter 352. This can result in photon recycling conversion previously described and described in U.S. patent application Ser. No. 13/770,389 to Lowes et al. In another embodiment, the wavelength conversion layer 364 does not cover the entire top surface, but does cover the emitter 352. In the specific embodiment shown, the wavelength conversion layer 364 is deposited on the insulating layer 360 and reflective insulating layer 362, although other embodiments are possible. This order, however, can be advantageous, in that deposition before the reflective layer could prevent conversion of recycled light, and deposition before the insulating layer could cause portions of the wavelength conversion layer to be displaced during deposition of the insulating layer. However, in another embodiment the insulating layer can be between the reflective layer and the wavelength conversion layer.

It should be understood that the exact configuration shown in FIGS. 7A and 7B is only one embodiment and should not be construed as limiting. Wavelength conversion layers such as the layer 364 and those described above can be utilized in any embodiments of the present invention, including but not limited to those described herein, as would be understood by one of skill in the art. Further, it is understood that wavelength conversion layers according to the present invention can be applied before or after any of the insulating layers described herein.

Although all of the previous embodiments have shown only a single emitter, any of these embodiments and those described below can include two or more emitters. For example, FIGS. 8A and 8B show a package 400 similar in many ways to the package 100 from FIGS. 2A-2C, but with two emitters 402a,402b. The package 400 can include a submount 404 and lens 408, as well as traces 406 that can be patterned to accommodate the number of emitters present. The package 400 can include insulating layers 410a, 410b which cover the emitters 402a,402b. The remainder of the top surface of the submount 404 is shown as uncovered, but it is understood that any of the layers described above can be included, such as a reflective insulating layer and/or a wavelength conversion layer, for example, or the insulating layers 410a,410b could expand further beyond the footprint of the emitters 402a,402b.

FIGS. 9A and 9B shows another multi-emitter package according to the present invention. The package 450 can include two or more emitters, such as the five emitters 452 shown, and can also include a submount 454 with top surface 454a, conductive traces (not shown), and a lens 458. In embodiments where a large portion of the top surface of the submount is covered by emitters, such as the top surface 454a with a large portion covered by emitters 452, the manufacturing efficiency benefits of covering the entire submount top surface with an insulating layer may outweigh the additional material expenditure. For example, the package 450 includes a top surface 454a which is covered by an insulating layer 460 (which can be similar to or the same as any of the above insulating layers). It is understood that different types of other elements not explicitly shown in the package 450 can also be included (e.g., a reflective insulating layer, a wavelength conversion layer, etc.).

Additionally, FIGS. 9A and 9B show two emitters 452a, 452b having undercuts. The emitters 452a,452b include at least one outer and/or side surface which angles inward as it approaches the submount 454. The coating of the insulating layer on undercut emitters can be done in many different manners, two of which are best shown in FIG. 9B. The emitter 452a, for example, is coated conformally, where the thickness of the insulating layer 460 is substantially uniform around the entire emitter 452a. This can result in a more uniform emission. The emitter 452b, on the other hand, is coated in a "box" manner which can result in the insulating layer 460 having substantially vertical sidewalls which do not follow the contour of the undercut. In a similar embodiment, the insulating layer over an emitter can form a parabolic shape and/or have sidewalls angling away from the emitter as they approach the submount. These methods can result in reduced manufacturing complexity. It is understood that any of the packages described herein, including those described above and hereafter, can include one or more emitters having undercuts which can be coated in any number of ways, including but not limited to conformal, box, and parabolic coatings.

Figure 10A:
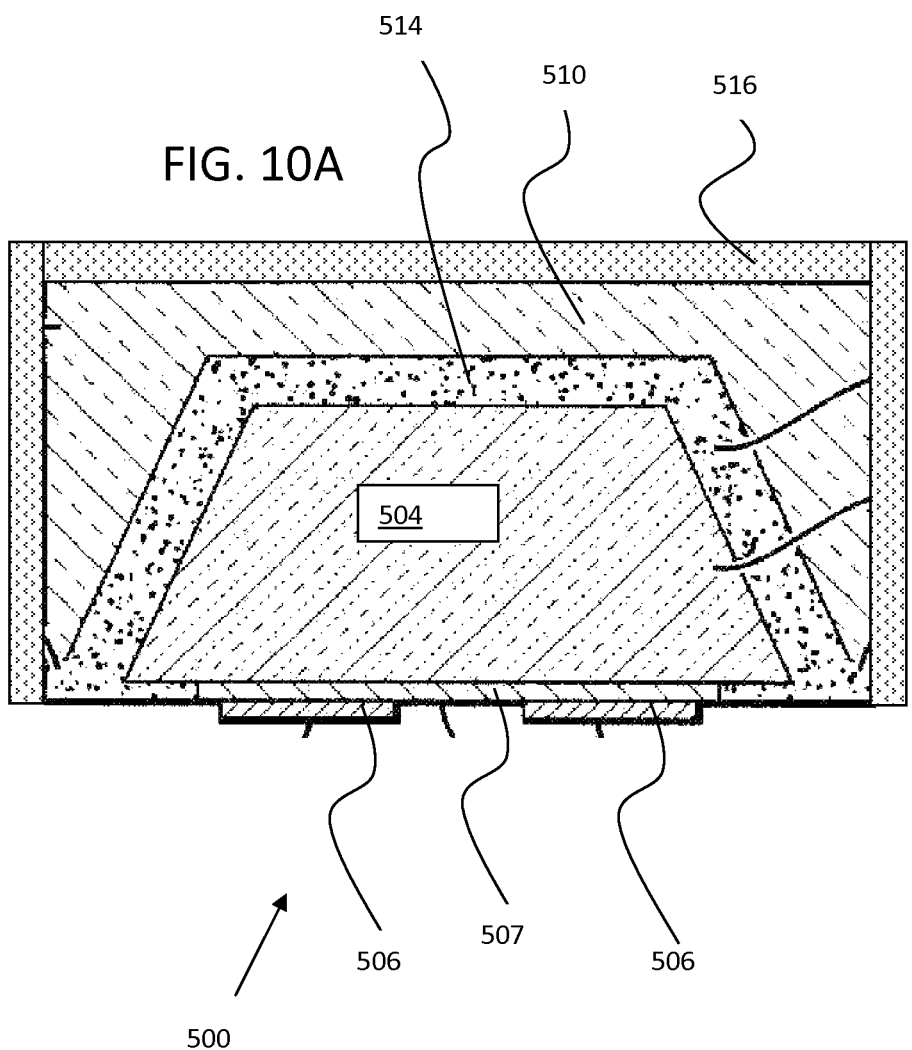
FIGS. 10A-10D are sectional views of emitter components according to the present invention.

FIG. 10A shows an emitter according to the present invention. The emitter 500 bears some similarities to emitters described in commonly assigned U.S. patent application Ser. No. 13/759,229 to Hussell et al. and entitled "Submount-Free Light Emitting Diode (LED) Components and Methods of Fabricating Same", and commonly assigned U.S. patent application Ser. No. 14/053,404 to Heikman et al. and entitled "Chip with Integrated Phosphor", each of which is fully incorporated by reference herein in its entirety. U.S. patent application Ser. No. 14/053,404 to Heikman et al. refers to the formation of "virtual wafers," or individual devices bound together via one or more layers instead of a submount wafer. Layers holding together the devices of a virtual wafer can include, for example, phosphor layers, silicone layers, and/or glass layers. FIG. 10A shows a single device 500, but other devices could be, for example, on the left and right of the device 500 and connected via single layers or combinations of layer 510 and/or layer 514 and/or layer 516, which will be described below.

The emitter 500 can include a substrate 504 and a diode region (not shown, on the bottom surface of the substrate 504), as well as contacts 506 which can be mounted on traces in a package. In the embodiment shown the emitter 500 also includes an optional reflective layer 507. In the embodiment shown, the emitter includes a phosphor layer 514 and a utility layer 516 which can be made of many different materials, including but not limited to silicone and glass. Utility layers according to the present invention can act as lenses and/or encapsulants. While the utility layer 516 is shown on both the top and side surfaces in this embodiment, it can be on less than all of these surfaces, such as only on the top surface. Other embodiments are possible. Utility layers are discussed in detail in U.S. patent application Ser. No. 14/053,404 to Heikman et al.

In addition, the emitter 500 can include an insulating layer 510, which can be deposited before or after the emitter 500 is mounted on a submount. The insulating layer can be below the utility layer 516 such that if the utility layer 516 is sheared off, the surface of the emitter 504 is still insulated. The insulating layer 510 can be similar to or the same as the insulating layers previously described, such as the layer 110 from FIGS. 2A-2C.

Figure 10B:
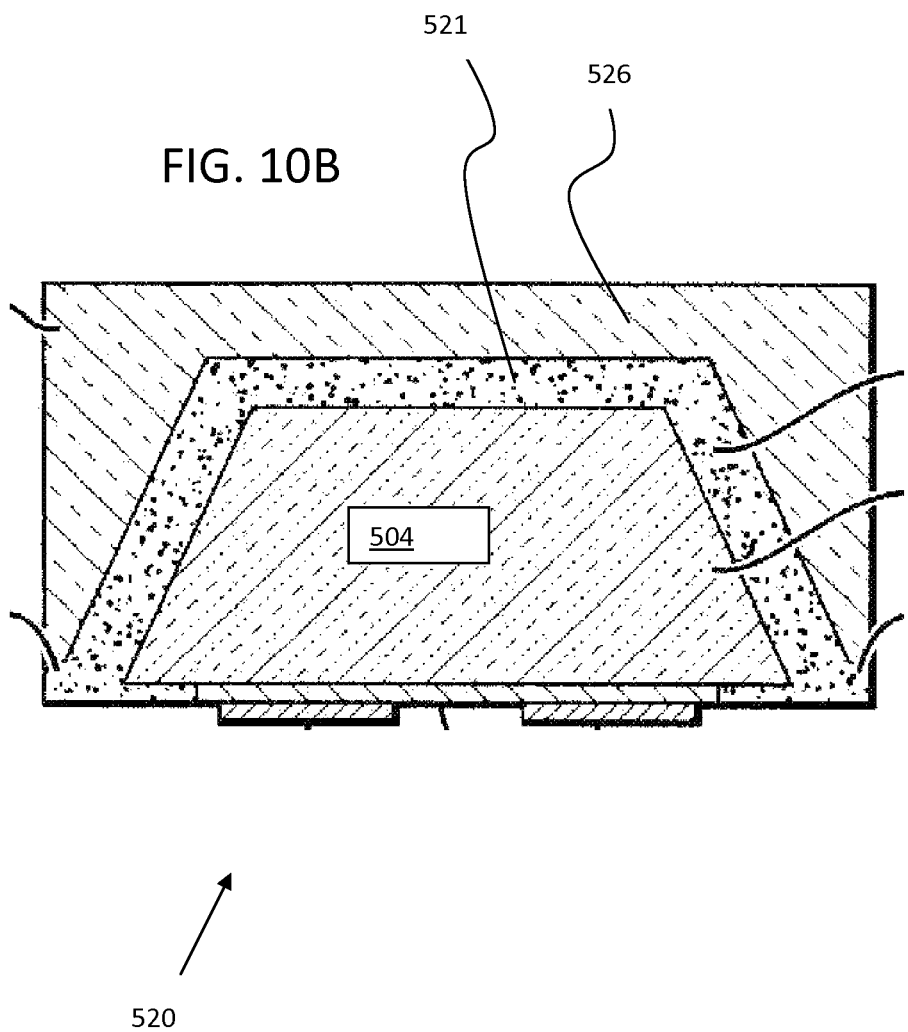
Figure 10C:
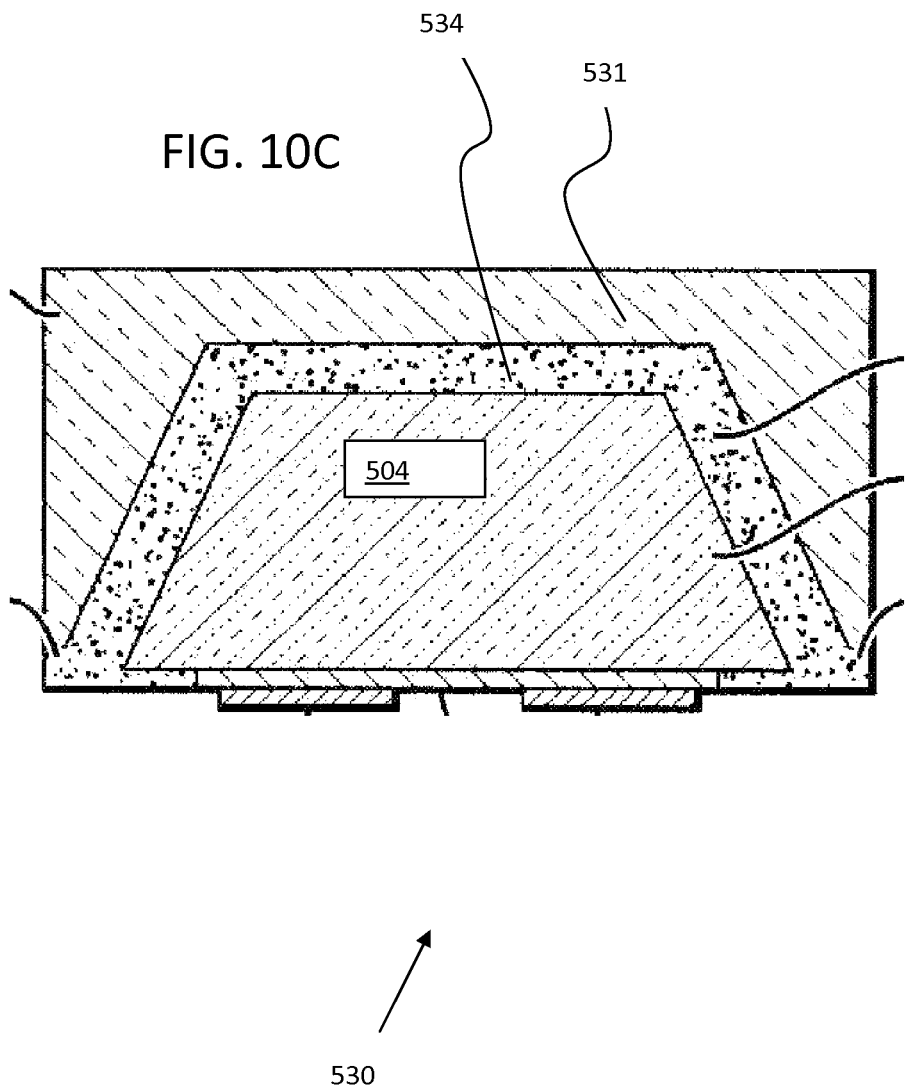
Figure 10D:
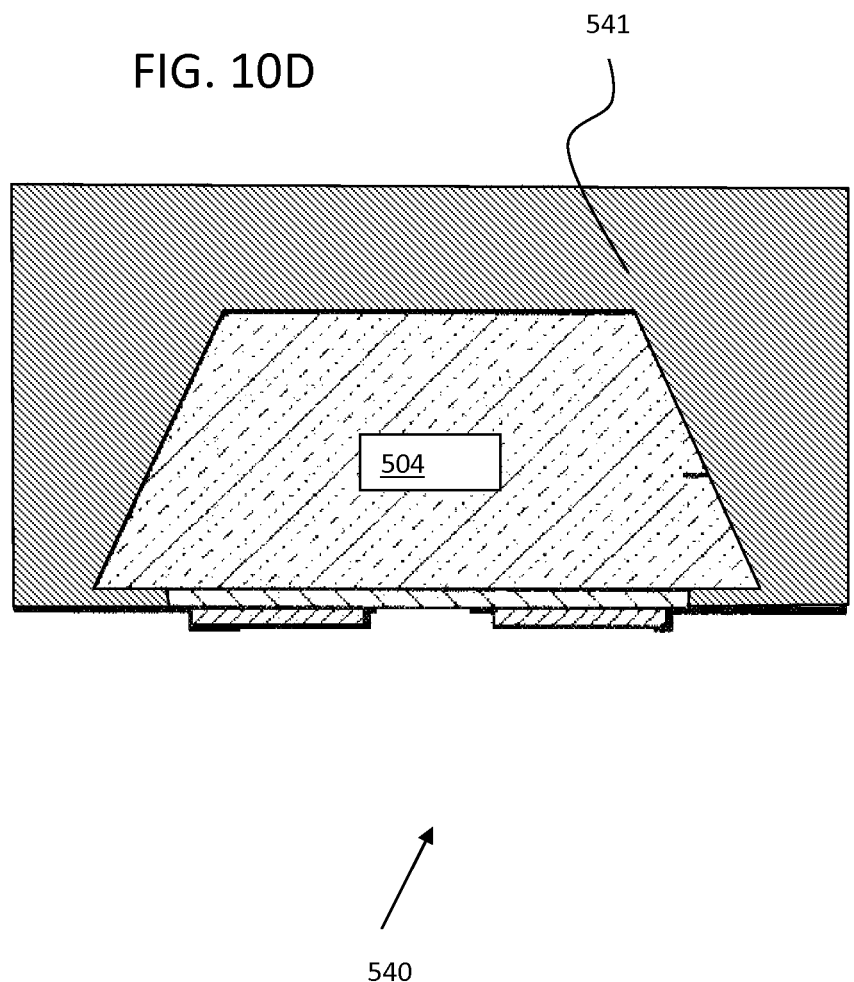

It is understood that embodiments of the present invention can include many different layers, including but not limited to the layers 510,514,516 shown in FIG. 10A, in many different orders. FIGS. 10B-10D show examples of some variations, but many different variations are possible as would be recognized by one of skill in the art.

FIG. 10B shows an emitter 520 that can include many of the same elements as the emitter 500, with the same elements shown with the same indicators. However, the emitter 520 includes an insulating layer 521 that is conformal to the substrate 504 and diode layers. The emitter 520 can then optionally include a utility layer 526, which can be transparent and which can, by itself or in combination with one or more other layers, hold together multiple emitters 520 in a virtual wafer. In emitters not already including a wavelength converter, such as the emitter 520 and the emitter 540 from FIG. 10D, wavelength conversion material can be provided in another manner such as that described above with regard to phosphor layers or other manners known in the art (e.g., placement in a lens, etc.).

FIG. 10C shows an emitter 530. The emitter 530 can include a phosphor layer 534. However, instead of the traditional silicone or glass utility layer, the emitter 530 can include an insulating layer 531 comprising, for example, a dielectric. The insulating layer 531 can serve both as an insulator for purposes of meeting class 4 rating standards and/or can serve as a utility layer for virtual wafer purposes.

FIG. 10D shows an emitter 540 that is similar in many respects to the emitter 530. However, the emitter 540 may not include a phosphor layer, but instead may only include an insulating layer 541. Similar to the insulating layer 531, the insulating layer 541 can serve as an insulator for class 4 rating standards and/or can serve as a utility layer for virtual wafer purposes.

Figure 11A:
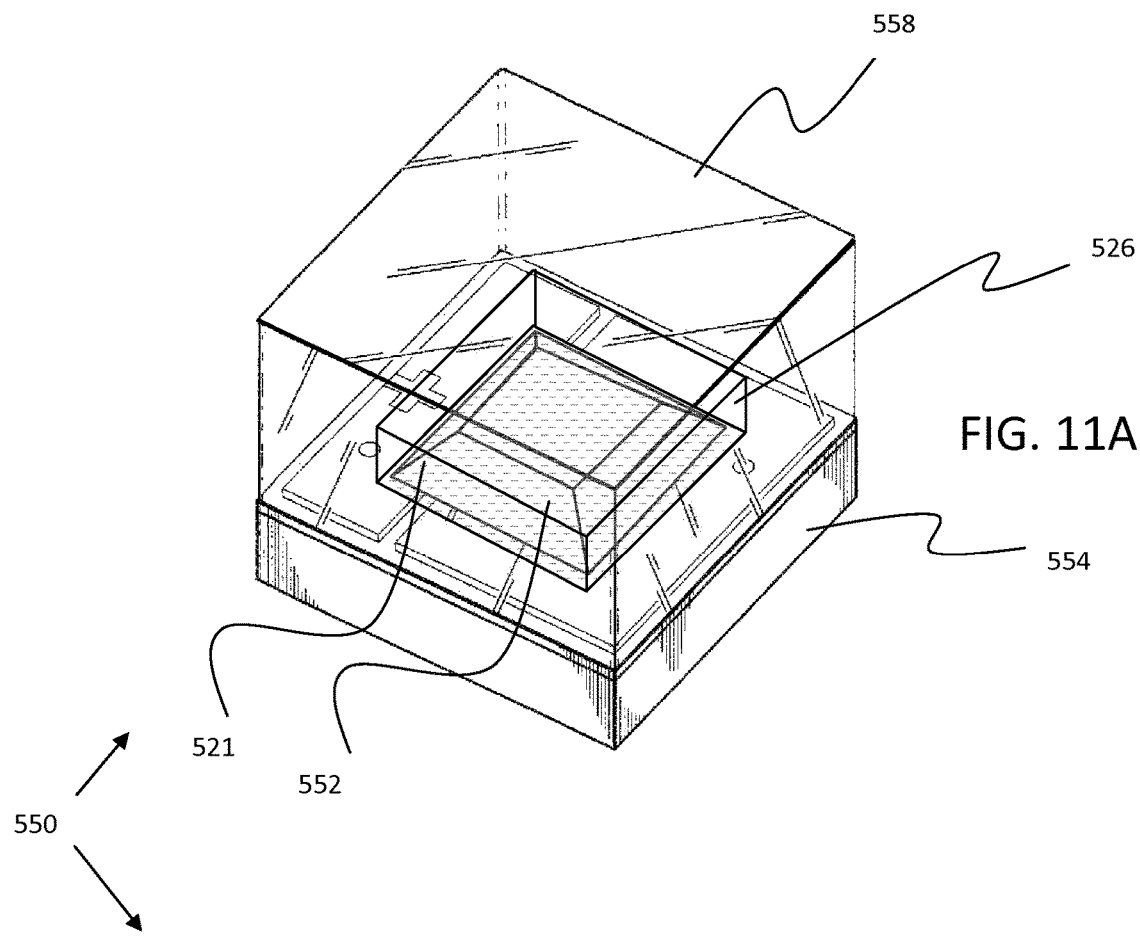
FIGS. 11A and 11B are perspective and sectional views of one embodiment of an emitter package according to the present invention.
Figure 11B:
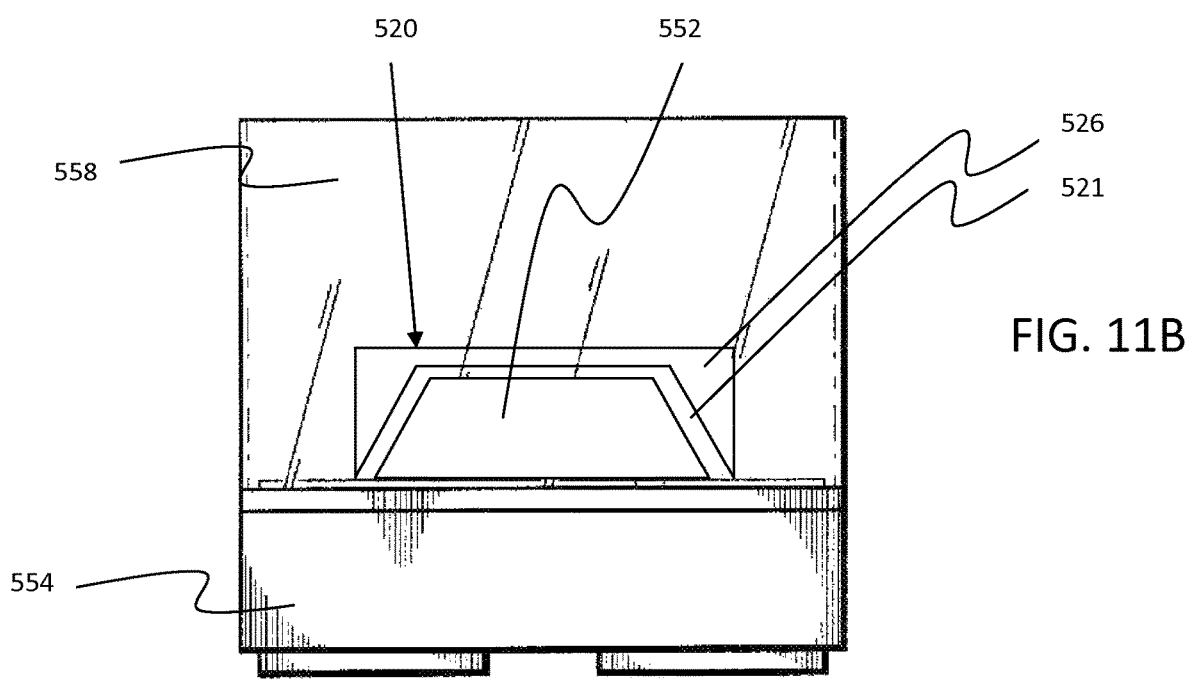

FIGS. 11A and 11B show a package according to the present invention that includes the emitter 502 from FIG. 10B, although it is understood that any one or more of the emitters described above with regard to FIGS. 10A-10D and/or U.S. patent application Ser. No. 14/053,404 can be included in packages in the present invention. Further, any of the other components described above, although not depicted, could be included. For example, because the emitter 520 did not necessarily include a wavelength conversion material, a wavelength conversion layer similar to the layer 364 from FIGS. 7A and 7B could be included.

As previously discussed, while one failure point in the UL8750 hi-pot test is conduction occurring through an exposed surface, another failure method is arcing. Further, arcing can cause damage to an emitter. Underfill can be used both to increase the voltage at which arcing occurs and to control the location where it occurs. Underfill and its uses are described in commonly assigned applications U.S. patent application Ser. No. 13/369,996 to Donofrio and entitled "Gel Underfill Layers for Light Emitting Diodes and Methods of Fabricating Same", and U.S. patent application Ser. No. 12/008,477 to Chitnis et al. and entitled "Flip-Chip Phosphor Coating Method and Devices Fabricated Utilizing Method", each of which is fully incorporated by reference herein in its entirety. One common underfill material is silicone, and in particular a gel-like silicone can be used.

Figure 12A:
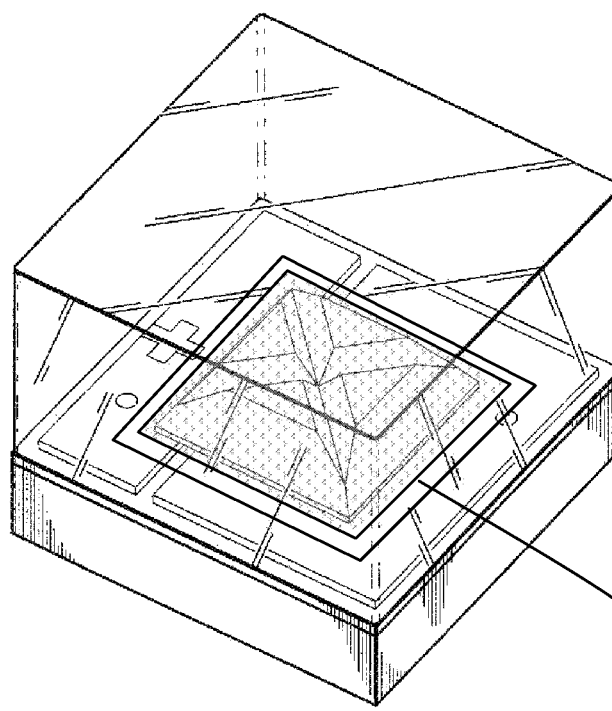
FIGS. 12A and 12B are perspective and sectional views of one embodiment of an emitter package according to the present invention.
Figure 12B:
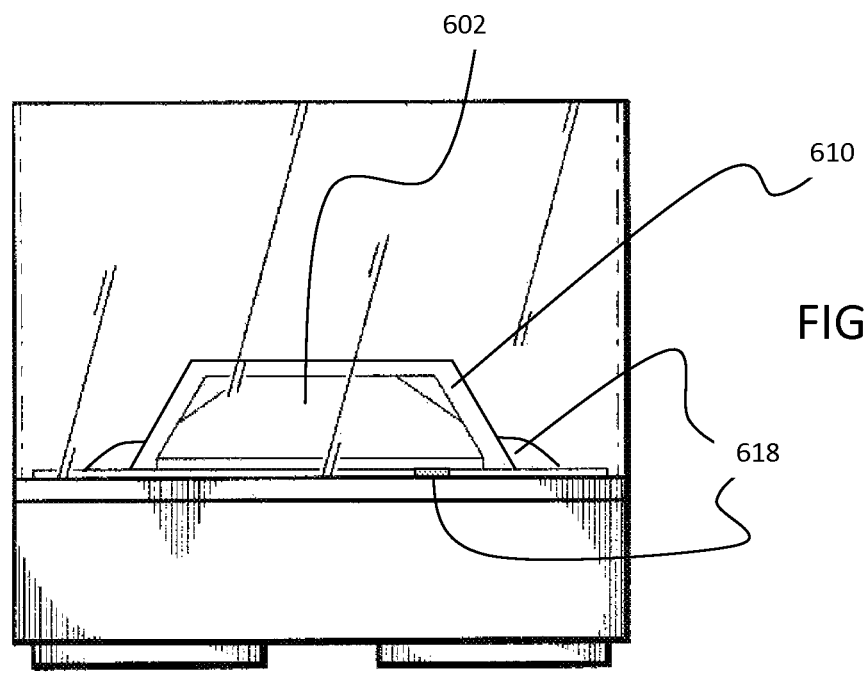

As can be seen in, for example, FIGS. 2A-2C and FIGS. 10A-10D, a small gap can sometimes remain between traces on a submount and/or contacts on the bottom of an emitter. FIGS. 12A and 12B show a package 600 similar in many respects to the package 100 from FIGS. 2A-2C and including such gaps. Underfill 618 can be deposited before or after an insulating layer in order to fill these gaps, which can lessen the likelihood of arcing and/or of an electrical short, and can also contribute to emitter stability.

Underfill can also be used to move the critical point for arcing further away from the emitter 602 and therefore lessen the chance of arcing damage occurring. In the UL 8750 hi-pot test of the package 100 from FIGS. 2A-2C, the critical point for arcing will likely be the point at the edge or corner of the insulating layer. By including underfill at this boundary in a manner similar to the underfill 618 in FIGS. 6A and 6B, the critical point for arcing can be moved to the outside edge of the underfill further from the emitter 602. Should arcing occur, the likelihood of damage to the emitter 602 can thus be lessened. It should be noted that while underfill 618 is not used with any layers other than an insulating layer 610 in the embodiment shown, it can be used with any of the layers described above, including but not limited to a reflective insulating layer and/or a wavelength conversion layer.

Another advantage of the use of underfill is to cover small exposed conductive areas that may still be present due to manufacturing realities. For example, where an insulating layer such as a solder mask is placed prior to placement of an emitter, the solder mask opening may be slightly larger than the emitter. Small areas of conductive trace, such as areas with dimensions of about 10 μm to about 150 μm, may be exposed. An underfill can cover these areas, which may otherwise be accessible to hi-pot probing. Another such instance is when one or more face-down contacts are not completely buried by the emitters. These are just a few instances where underfill can have advantages, and many other embodiments are possible.

Figure 13A:
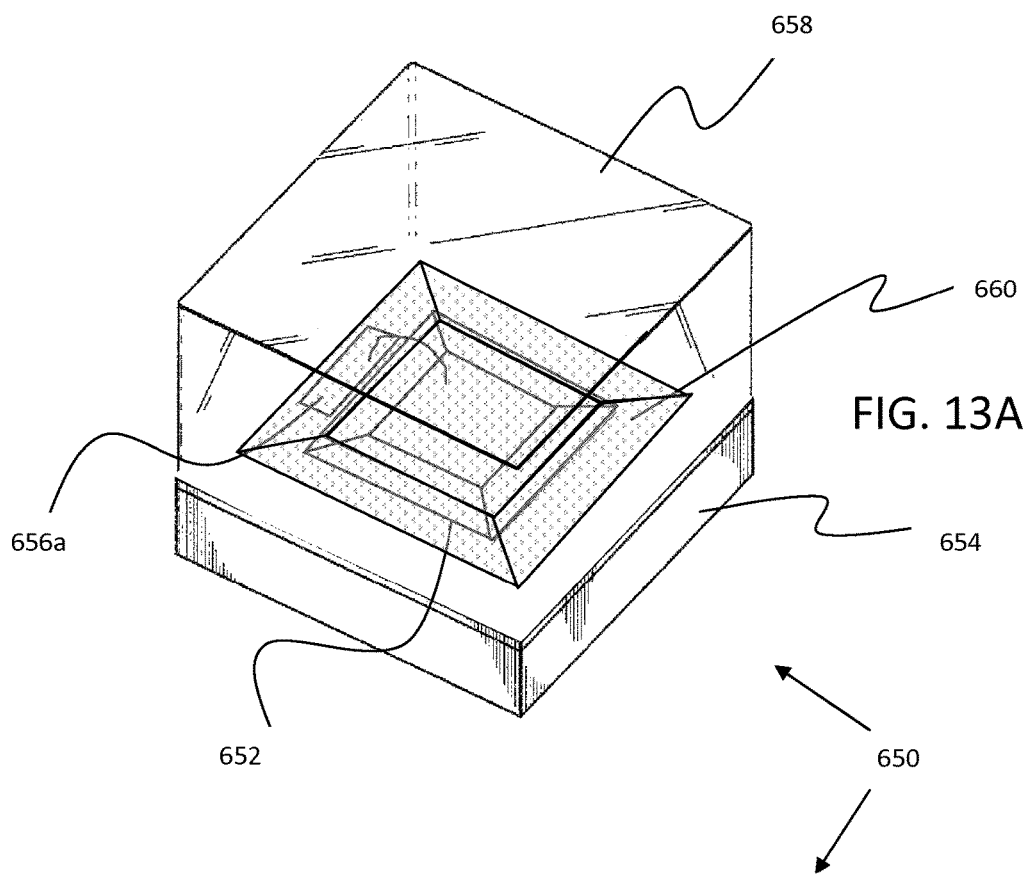
FIGS. 13A and 13B are perspective and sectional views of one embodiment of an emitter package according to the present invention.
Figure 13B:
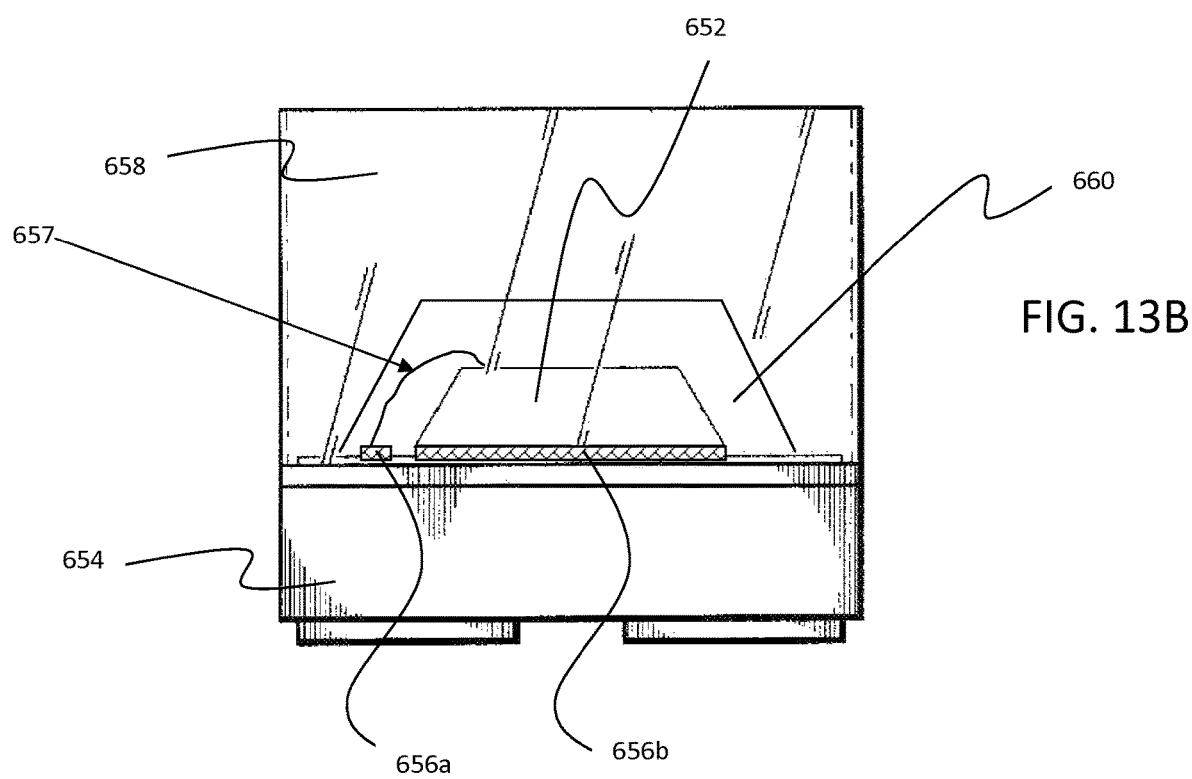

The above embodiments of packages have focused upon horizontally-oriented packages that are direct-attached and/or flip-chip mounted on a submount, which have distinct advantages in that the contacts are "buried" and not exposed. However, other embodiments are possible, including both vertically oriented devices and horizontally oriented devices with contacts on a top surface. FIGS. 13A and 13B show one such package 650 according to an embodiment of the present invention which can include an emitter 652, a submount 654, traces 656a,656b, and a lens 658. An exemplary emitter is the XT290 from CREE, INC., the data sheet of which is fully incorporated by reference herein in its entirety, although many different types of emitters are possible. Typically packages having wire bonds that do not meet the class 4 lens adhesion standards cannot achieve a class 4 rating, as the wire bonds will be exposed if the lens were to be removed. However, the package 650 can include an insulating layer 660 that can be designed to envelope the wire 657, which can connect the trace 656a to the emitter 652, such as to a topside contact on the emitter 652. The insulating layer can also cover all of the trace 656a. The package 650 could also include, for example, a reflective insulating layer, a wavelength conversion layer, or any of the other elements discussed above with regard to other embodiments. In order to cover the necessary surfaces, an insulating layer such as that described above may be thicker than those previously described.

Figure 13C:
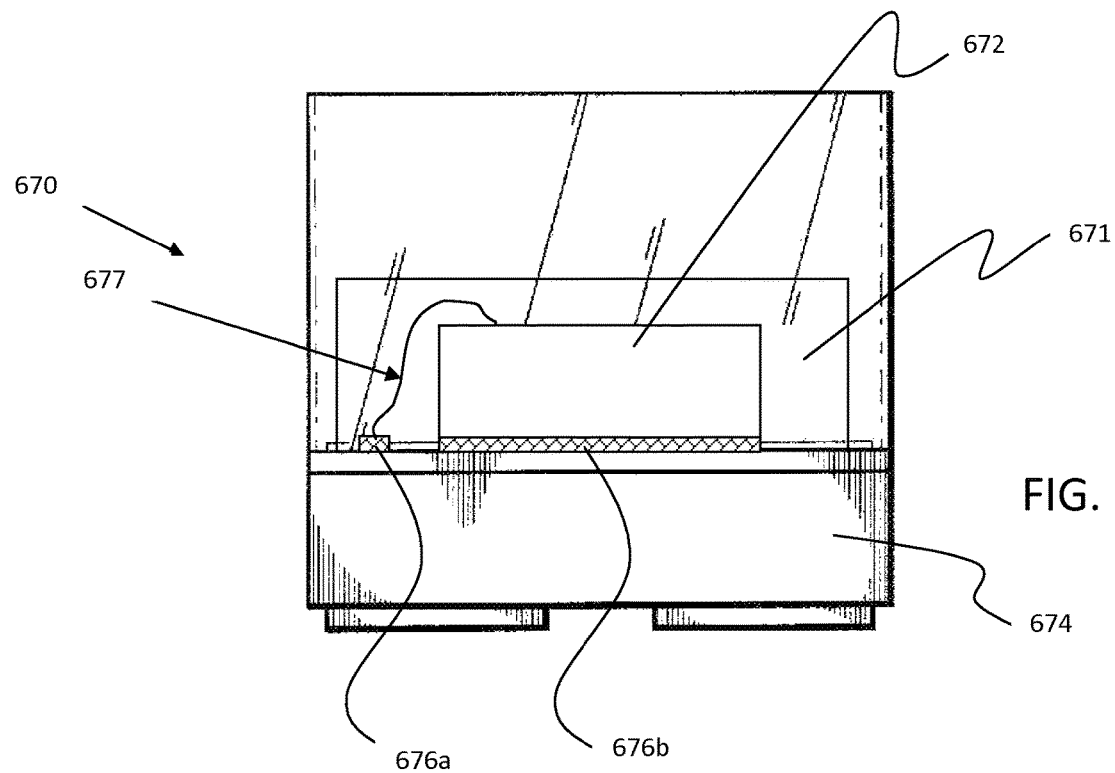
FIGS. 13C and 13D are sectional views of two embodiments of an emitter package according to the present invention.

Other embodiments with some of the attributes of that shown in FIGS. 13A and 13B are also possible. For example, FIG. 13C shows a package 670 according to one embodiment of the present invention. The package 670 includes a rectangular vertically-oriented emitter 672, which can include topside and bottomside contacts. Some examples of such emitters include the EZ line of emitters available from CREE, INC., although many different emitters are possible. The emitter 672 can be on, such as mounted on, a conductive trace or contact 676b. A topside contact can be connected via a medium such as a wire bond to a conductive trace or contact 676a, which can be on the top surface of the submount 674, for example. The emitter 672, contacts/traces 676a,676b, and/or conductive medium 677 can be covered by the insulating layer 671, which can have any of the properties described above with regard to insulating layers according to the present invention. By covering all conductive surfaces beneath the encapsulant, the package 670 can meet the UL 8750 class 4 rating standards.

Figure 13D:
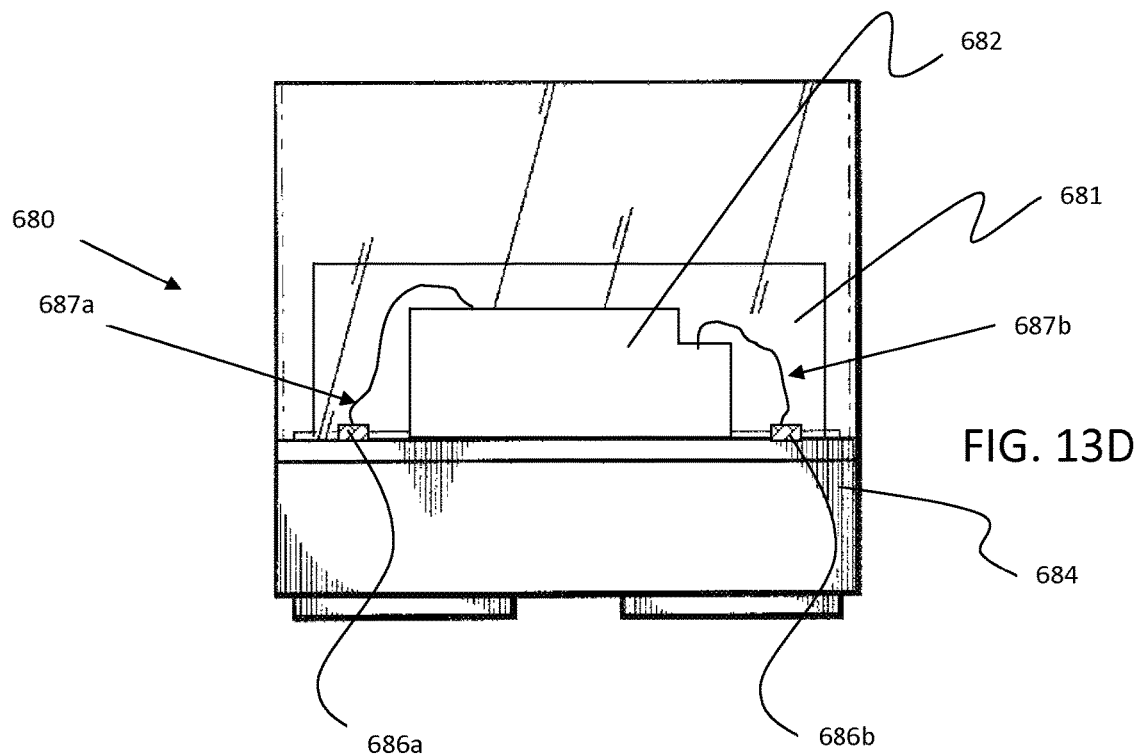

FIG. 13D shows a package 680 with many similarities to the package 670 from FIG. 13C. The package 680, however, can include a horizontally-oriented emitter 682. The emitter 682 can include two top-side contacts (not shown), which can be electrically connected via conductive medium such as wires 687a,687b. The wires 687a,687b can be connected to conductive traces or contacts 686a,686b, which can be on the top surface of the submount 684. In the embodiment shown, all conducting surfaces, including the contacts 686a, 686b, conductive media 687a,687b, and/or the emitter 682 can be covered by an insulating layer 681, which can have any of the properties described above with regard to insulating layers according to the present invention.

Any of the layers described above with regard to FIGS. 2A-13B can be applied in a number of different ways, including but not limited to chemical vapor deposition (CVD), physical vapor deposition (EVD), spinning on, dispensing, brushing, painting, dipping, spraying, and/or screen-printing, for example. One preferred method for depositing insulating layers according to the present invention is CVD.

Figure 14A:
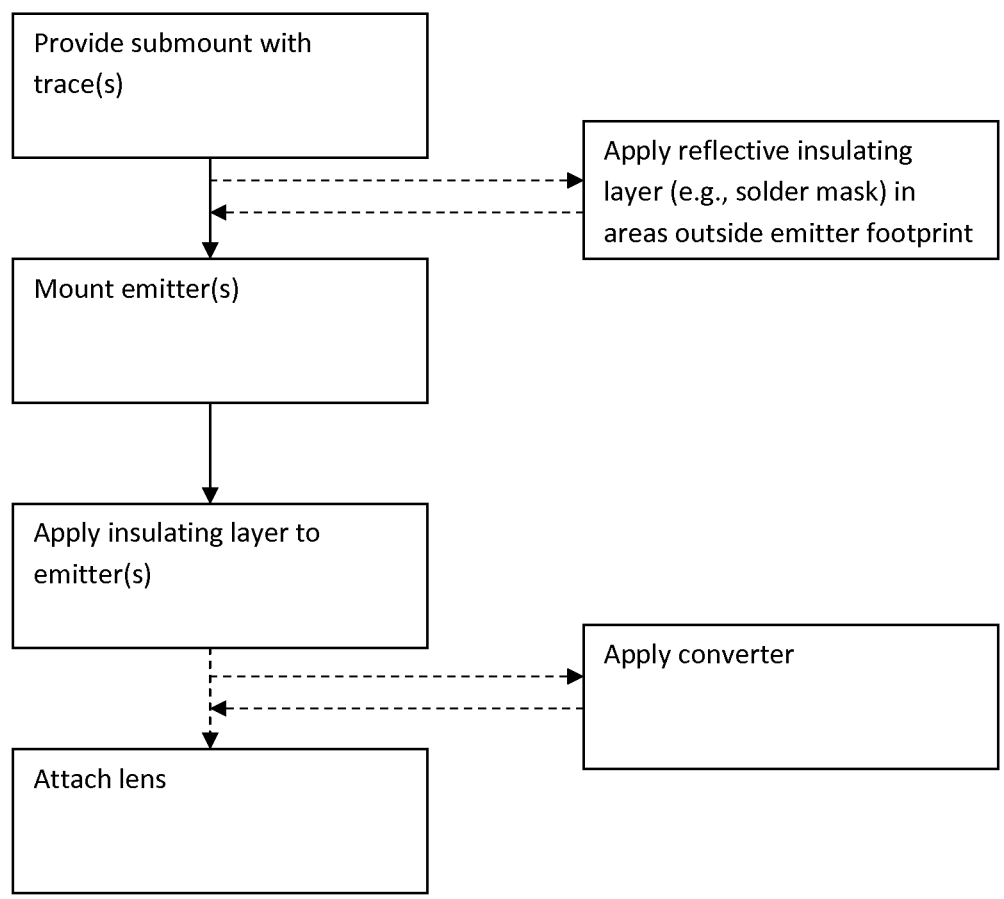
FIGS. 14A-14D show different embodiments of methods for forming emitter packages according to embodiments of the present invention.

FIGS. 14A-14D show different fabrication methods according to embodiments of the present invention, with optional steps shown with dashed arrow lines (although other steps may also be omitted in some embodiments). In the embodiment of FIG. 14A, after providing a submount with traces such as the traces 106a,106b from FIGS. 2A-2C, a reflective insulating layer such as the layer 212 from FIGS. 4A-4C can optionally be deposited. This layer can cover areas outside the area in which one or more emitters are to be mounted. Example areas include the entire submount top surface outside the emitters, any exposed conductive surfaces, and/or exposed surfaces of the traces (if the traces are exposed and/or outside the footprint of the emitter(s)). In step 1406, one or more emitters can be mounted on areas at least partially, and sometimes wholly, uncovered by the reflective insulating layer (if present). The insulating layer can then be applied to the emitter(s), as previously described. In an optional step, a converter can be applied in one of many different manners. For example, a wavelength conversion layer similar to layer 364 from FIGS. 7A-7C can be deposited over most or all of the top surface of the submount. Alternatively, a coating of wavelength conversion material can be applied selectively to areas on and/or around the emitter(s). In another method, this step is skipped altogether and/or a conversion material may be included in the lens, which is attached in step 1412. The lens can be attached by, for example, molding.

Figure 14B:
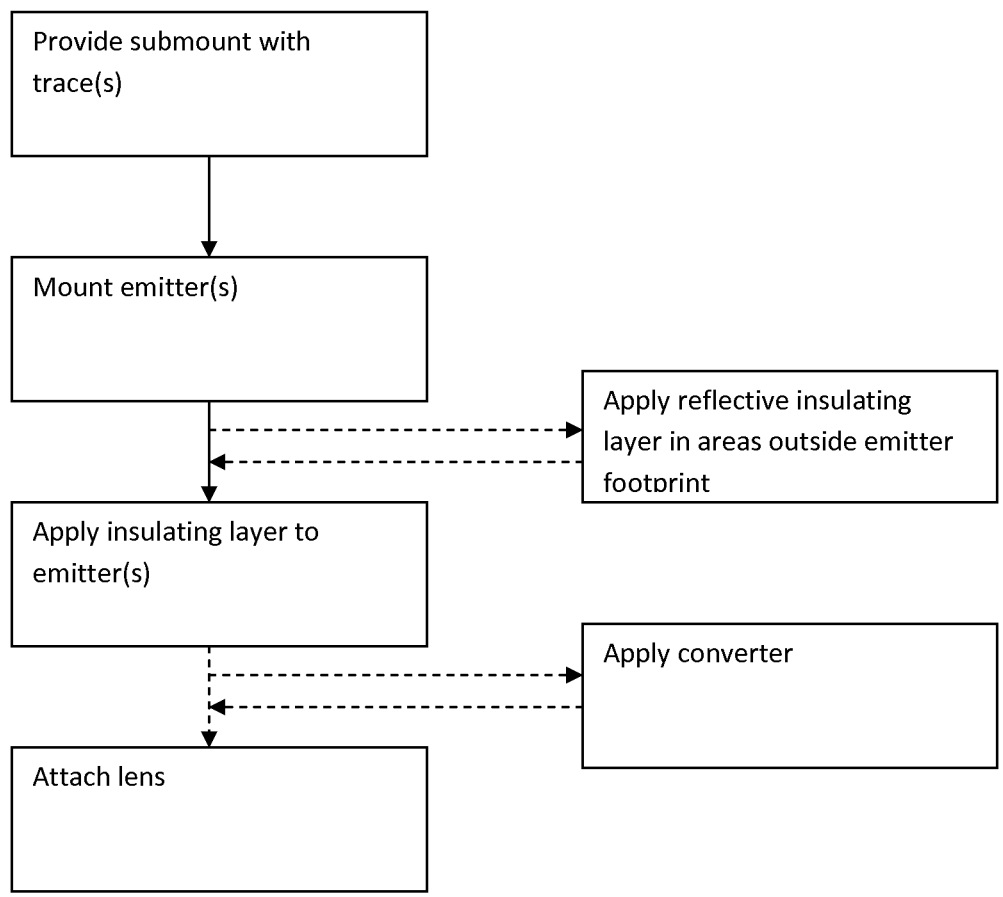
Figure 14C:
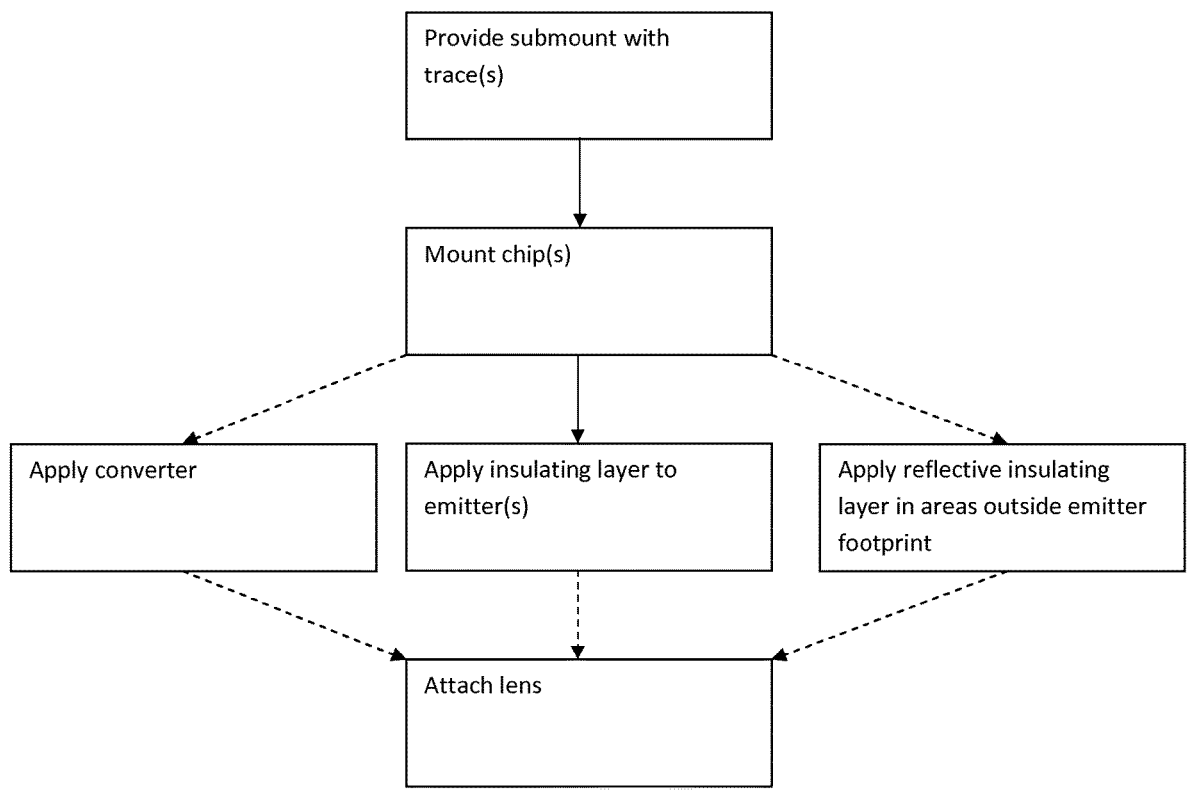

Many different variants of the method shown in FIG. 14A are possible. For example, as shown in FIG. 14B, a reflective insulating layer could be applied after one or more emitters are already attached. As another example shown in FIG. 14C, one to three or even more than three different steps can be completed in any order between the mounting of the emitter(s) and the attachment of a lens, with the three steps shown including applying a converter, applying an insulating layer to emitter(s), and applying a reflective insulating layer in areas outside the emitter footprint, although many steps are possible.

Figure 14D:
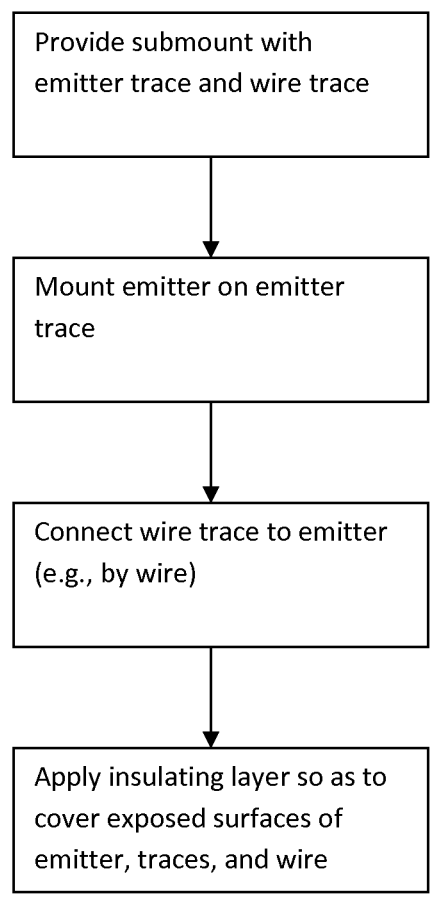

FIG. 14D shows a method specifically adapted for fabricating emitters according to the present invention that require a wire bond. It is understood that steps described above could also be included in the method of FIG. 14D at various points in the process. In this method, after an emitter is mounted on one trace, the emitter is electrically connected to another trace. Then, an insulating layer (e.g., the insulating layer 660 from FIGS. 13A and 13B) can be applied and cover all exposed electrical surfaces, including exposed conductive surfaces of the emitter, trace(s), and connecting medium or component (e.g., a wire). One method in particular of completing this step is to mold and cure the insulating layer such that it covers these conductive materials, although many different formation/deposition methods are possible.

In any of the above methods, the use of a descumming process may also increase the effectiveness of the insulation layer which lies between the probes and conductive surfaces of the device(s) during a hi-pot test of the devices. For example, if a photo resist is used during any processes involved in generating the insulating layer, a descumming process could remove any remaining residue so as to reduce the likelihood of defects in the electrical insulation, such as pinholes, variable thickness, and/or poor adhesion.

Examples and Test Results

A control first round of testing was conducted on a package including a DA1000 LED chip from CREE, INC. The DA1000 includes a silicon carbide substrate. All packages failed the hi-pot test via conduction through the substrate in less than 20 seconds at a voltage of about 200 VAC, well under the 500 VAC class 4 requirement.

A second round of testing was conducted on a package including a DA3547 LED chip from CREE, INC., also including a silicon carbide substrate. The substrates were covered with one or more dielectric layers. The test was run with a DC source three times on each component with a typical metal probe, and three times with a metal probe and a Cu cushion in an attempt to lessen the likelihood of mechanical failure, such as due to brittleness of the dielectric layers used in the tests. The following components passed both with and without the Cu cushion:
1. De-scum, 5000 A $SiO_2$, 5000 A SiN, phosphor/silicone layer
2. De-scum, 5000 A SiN, 5000 A $SiO_2$, phosphor/silicone layer
3. 5000 A $SiO_2$, 5000 A SiN, phosphor/silicone layer
4. 5000 A SiN, 5000 A $SiO_2$, phosphor/silicone layer
5. 2 µm SiN (passed hi-pot threshold criteria, electrical breakdown at 800-830 VDC via arcing)
6. 4 µm-5 µm parylene, phosphor/silicone layer It is understood that different emitter package embodiments can have different combinations of the emitters, layers, and/or other components described above. Each of the configurations of insulating layers, reflective insulating layers, and wavelength conversion mechanisms such as wavelength conversion layers can be used in any combination and be deposited in any order. It is understood that the different emitters described above are only a few of the many different emitters that can be used in packages according to the present invention.

The packages according to the present invention can serve as the light source for lamps such as those described in U.S. patent application Ser. No. 13/034,501, to Le et al., entitled "Solid State Lamp", and U.S. patent application Ser. No. 13/028,946, to Le et al., entitled "High Efficacy LED Lamp With Remote Phosphor and Diffuser Configuration", each of which is fully incorporated herein by reference in its entirety.

The LED packages can also be used in troffer type lamp fixtures such as those described in U.S. patent application Ser. No. 13/368,217 to Pickard et al., entitled "Multiple Panel Troffer Style Light Fixture", and U.S. patent application Ser. No. 12/873,303, Edmond et al., entitled "Troffer-Style Fixture", each of which is fully incorporated by reference herein in its entirety.

The LED packages can also be used in many other lighting applications such as LED displays, LED street lighting, residential LED downlighting, etc. Some LED package embodiments of the present invention are particularly applicable to fluorescent tube replacement LED lighting with the emission pattern of the LED packages being desirable for linear arrays such as those used in fluorescent tube replacements.

The LED packages can be arranged with many different features beyond those described above. Some embodiments can comprise electrostatic discharge (ESD) protection elements or devices. Others of the LED packages can be arranged with secondary optics to further disperse, spread or columnate the package beam profile. In still other embodiments, different ones of the LEDs within the package can be mounted higher than others of the LEDs to provide the desired LED package emission pattern.

Although the embodiments above are often described herein with reference to LED packages with conversion material layers, it is understood that other embodiments can be provided without a conversion material layer. Some of these embodiments can comprise a blue, red or green LED chip by itself to provide LED packages emitting blue, red or green light. Other embodiments can also comprise multiple LED chips emitting different colors of light such as red, green or blue emitting LEDs, or red, green, blue, and white emitting LEDs, or red, green, blue, and amber LEDs. These are only some of the combinations that are possible in different embodiments according to the present invention.

The LED packages can be arranged with many additional features, such as adaptors or connectors to allow for handing and mounting of these relatively small packages. The different LED package embodiments can comprise different markings or other features to assist in alignment, or the mounting area can have marks or features to assist in alignment and mounting of the LED packages. Some such features are described in U.S. patent application Ser. No. 14/271,116 to Wilcox et al. and entitled "Optical Element with Integrated Indicator," which is fully incorporated by reference herein in its entirety.

Although the present invention has been described in detail with reference to certain preferred configurations thereof, other versions are possible. The invention can be used in any light fixtures where a uniform light or a near uniform light source is required. In other embodiments, the light intensity distribution of the LED module can be tailored to the particular fixture to produce the desired fixture emission pattern. Therefore, the spirit and scope of the invention should not be limited to the versions described above.

We claim:
1. An emitter package, comprising:
 a submount;
 an emitter on said submount;
 an encapsulant on said emitter;
 an electrically insulating layer on an electrically active surface of said emitter configured to be retained on said electrically active surface should said encapsulant be removed from said emitter; and
 wherein said insulating layer is conformal to at least three sides of said emitter, and wherein said electrically insulating layer comprises an emitter-side interface between said emitter and said electrically insulating layer and said electrically insulating layer comprises an encapsulant-side interface between said encapsulant and said electrically insulating layer, wherein adhesion on said emitter-side interface is greater than adhesion on said encapsulant-side interface.
2. The emitter package of claim 1, wherein said insulating layer covers said emitter such that no portion of said encapsulant is directly on a portion of said emitter.
3. The emitter package of claim 1, wherein said emitter comprises a substrate and one or more diode layers; and
 wherein said diode layers are between said substrate and said submount.
4. The emitter package of claim 3, wherein said substrate is electrically conductive.
5. The emitter package of claim 3, wherein said substrate comprises SiC.
6. The emitter package of claim 1, wherein said insulating layer is substantially transparent.
7. The emitter package of claim 1, wherein said insulating layer is about fpm thick or thicker.
8. The emitter package of claim 1, wherein said insulating layer is about 3 µm thick or thinner.
9. The emitter package of claim 1, further comprising one or more conductive traces;
 wherein said emitter is on at least one of said conductive traces; and
 wherein said insulating layer is configured to prevent conduction between a probe on said insulating layer and a probe on said at least one conductive trace at a voltage of 710 VDC or 500 VAC for sixty seconds or more.

10. The emitter package of claim 1, further comprising a reflective insulating layer on said submount outside the footprint of said emitter.

11. The emitter package of claim 1, wherein said electrically insulating layer covers all conductive surfaces on a top surface of said submount.

12. The emitter package of claim 1, further comprising one or more conductive traces on said submount;
wherein said one or more conductive traces are covered by said emitter.

13. The emitter package of claim 1, wherein emitter said comprises a topside contact, and further comprising:
a conductive trace on said submount; and
a component electrically connecting said conductive trace to said topside contact;
wherein said electrically insulating layer covers said conductive trace, said component, and said topside contact.

14. The emitter package of claim 1, wherein said emitter is shaped to define at least one undercut.

15. The emitter package of claim 1, further comprising underfill between said emitter and said submount.

16. The emitter package of claim 1, wherein said emitter package is configured such that no electrically active components on a top surface of said submount would be exposed should said encapsulant be removed.

17. The emitter package of claim 1, wherein said emitter package is configured such that said insulating layer is retained on the remainder of the package should said encapsulant fail to withstand a force of 30N applied for five seconds.

18. The emitter package of claim 1, wherein said insulating layer is configured to withstand a force of 30N applied for five seconds.

19. The emitter package of claim 1, further comprising a wavelength conversion layer covering the top surface of said emitter but less than all of the top surface of said submount.

20. An emitter package, comprising:
a mount surface;
an emitter on said mount surface;
a first insulating layer on and conformal to said emitter;
a second insulating layer distinct from said first insulating layer on said mount surface around said emitter; and
an encapsulant on said first and second insulating layers;
wherein said first insulating layer comprises a dielectric and is substantially transparent, and said second insulating layer is reflective, wherein said first insulating layer is on an electrically active surface of said emitter, wherein the adhesion between said first insulating layer and said emitter is higher than the adhesion between said first insulating layer said encapsulant, wherein said first insulating layer is configured to be retained on said electrically active surface should said encapsulant be removed from said emitter.

21. The emitter package of claim 20, further comprising one or more traces on said mount surface;
wherein said first and second insulating layers collectively cover the portion of said traces outside the footprint of said emitter.

22. The emitter package of claim 20, wherein said second insulating layer covers all of the portion of said mount surface uncovered by said emitter and said first insulating layer.

23. The emitter package of claim 20, further comprising a wavelength conversion layer on said emitter.

24. The emitter package of claim 23, wherein said wavelength conversion layer is on said mount surface outside the footprint of said emitter.

25. The emitter package of claim 20, further comprising a conversion material in said encapsulant.

26. The emitter package of claim 20, wherein the adhesion between said second insulating layer and said mount surface is stronger than the adhesion between said second insulating layer and said encapsulant.

27. The emitter package of claim 26, wherein said second insulating layer is configured to be retained on said mount surface should said encapsulant or be removed from said emitter.

28. An emitter component, comprising:
a substrate comprising a first substrate face and second opposing substrate face;
a diode region on said first substrate face;
first and second contacts on said first substrate face with said diode region between said substrate and said first and second contacts;
a submount, wherein said first and second contacts are on a mounting surface of said submount with said diode region between said substrate and said submount;
a first insulating layer on said second substrate face;
a reflective second insulating layer on said mounting surface around said diode region;
a wavelength conversion layer on and distinct from said insulating layer;
an encapsulant on and distinct from said wavelength conversion layer;
wherein said first insulating layer is conformal to at least three sides of said substrate and is on an electrically active surface, wherein the adhesion between said first insulating layer and said substrate is higher than the adhesion between any of said layers arranged on said insulating layer, wherein said insulating layer is configured to be retained on said electrically active surface should said encapsulant be removed from said diode region.

29. The emitter component of claim 28, wherein said substrate further comprises at least one side surface;
wherein said insulating layer is on said at least one side surface.

30. The emitter component of claim 28, wherein said insulating layer is substantially transparent.

31. The emitter component of claim 28, further comprising a layer between said insulating layer and said second face.

32. The emitter component of claim 28, wherein said insulating layer is about fpm or thicker.

33. The emitter package of claim 23, wherein said wavelength conversion layer covers the top surface of said emitter but less than all of the top surface of said mount surface.

34. The emitter component of claim 28, wherein said wavelength conversion layer covers the surface of said substrate but less than all of the surface of said insulating layer.

35. The emitter package of claim 28, further comprising a conversion material in said encapsulant.

36. The emitter package of claim 28, wherein the adhesion between said reflective second insulating layer and said mount surface is stronger than the adhesion between said second insulating layer and said encapsulant.

37. The emitter package of claim 36, wherein said second insulating layer is configured to be retained on said mount surface should said encapsulant or be removed from said emitter.

* * * * *